(12) United States Patent
    Hillman

(10) Patent No.: US 10,535,538 B2
(45) Date of Patent: Jan. 14, 2020

(54) SYSTEM AND METHOD FOR HEAT TREATMENT OF SUBSTRATES

(71) Applicant: Gary Hillman, Montville, NJ (US)

(72) Inventor: Gary Hillman, Montville, NJ (US)

(*) Notice: Subject to any disclaimer, the term of this patent is extended or adjusted under 35 U.S.C. 154(b) by 0 days.

(21) Appl. No.: 15/880,935

(22) Filed: Jan. 26, 2018

(65) Prior Publication Data
US 2018/0211854 A1    Jul. 26, 2018

Related U.S. Application Data

(60) Provisional application No. 62/450,622, filed on Jan. 26, 2017.

(51) Int. Cl.
    H01L 21/67    (2006.01)
    H01L 21/324   (2006.01)
    B05D 3/02     (2006.01)
    F27D 3/00     (2006.01)
    G03F 7/20     (2006.01)
    F27D 1/18     (2006.01)
    F27D 5/00     (2006.01)

(52) U.S. Cl.
    CPC ...... H01L 21/67103 (2013.01); B05D 3/0272 (2013.01); F27D 1/1858 (2013.01); F27D 3/0084 (2013.01); F27D 5/0037 (2013.01); G03F 7/70783 (2013.01); H01L 21/324 (2013.01)

(58) Field of Classification Search
    CPC ......... H01L 21/67103; H01L 21/68707; H01L 21/6838
    USPC .............................. 438/795; 257/3, 4, 7, 294
    See application file for complete search history.

(56) References Cited

U.S. PATENT DOCUMENTS

| 4,356,384 | A | * | 10/1982 | Gat | C30B 33/00 |
| | | | | | 148/DIG. 93 |
| 4,698,486 | A | * | 10/1987 | Sheets | F27B 17/0025 |
| | | | | | 118/50.1 |
| 5,081,773 | A | | 1/1992 | Brusati et al. | |
| 5,148,003 | A | | 9/1992 | Haj-Ali-Ahmadi et al. | |
| 5,380,399 | A | | 1/1995 | Miyashita et al. | |
| 5,716,207 | A | | 2/1998 | Mishina et al. | |
| 5,778,968 | A | * | 7/1998 | Hendrickson | C23C 16/4583 |
| | | | | | 118/725 |
| 6,036,793 | A | | 3/2000 | Melgaard et al. | |
| 6,172,337 | B1 | * | 1/2001 | Johnsgard | C23C 16/4411 |
| | | | | | 118/725 |
| 6,506,994 | B2 | | 1/2003 | Wang et al. | |
| 6,579,373 | B2 | * | 6/2003 | Moriyama | H01L 21/67017 |
| | | | | | 118/724 |
| 8,545,159 | B2 | | 10/2013 | Hwang et al. | |

(Continued)

Primary Examiner — Sheikh Maruf
(74) Attorney, Agent, or Firm — The Belles Group, P.C.

(57) ABSTRACT

A system and/or method for heat treatment of substrates. The system includes a housing that defines a heating chamber and a door assembly that encloses an opening of the heating chamber. The door assembly may be opened and closed. When opened, the door assembly defines a loading slot for loading substrates into and unloading substrates from the heating chamber. The door assembly is coupled to a first actuator and a control unit is coupled to the actuator to move the door assembly between a plurality of loading positions. The system may also include a loading assembly mounted to the door assembly to facilitate insertion and removal of substrates from the heating chamber.

20 Claims, 24 Drawing Sheets

(56) References Cited

U.S. PATENT DOCUMENTS

| | | | |
|---|---|---|---|
| 2002/0111043 A1* | 8/2002 | Mahawili | H01L 21/67115 438/795 |
| 2003/0199174 A1* | 10/2003 | Moriyama | H01L 21/67017 438/758 |
| 2005/0229855 A1 | 10/2005 | Raaijmakers | |
| 2007/0169373 A1* | 7/2007 | Aoki | H01L 21/67109 34/549 |
| 2007/0254493 A1* | 11/2007 | Salinas | H01L 21/67098 438/795 |
| 2008/0179006 A1* | 7/2008 | Tahara | C23C 16/401 156/345.29 |
| 2009/0029308 A1* | 1/2009 | Ishihara | H01L 21/324 432/249 |
| 2009/0209112 A1* | 8/2009 | Koelmel | H01L 21/68742 438/795 |
| 2010/0048035 A1* | 2/2010 | Azumano | B25J 9/042 438/795 |
| 2010/0267249 A1* | 10/2010 | Kim | F27B 17/0025 438/795 |
| 2010/0330815 A1* | 12/2010 | Hayashi | F27B 5/04 438/795 |
| 2012/0061374 A1* | 3/2012 | Yokouchi | F27B 17/0025 219/385 |
| 2012/0086107 A1* | 4/2012 | Yamamoto | C23C 16/405 257/632 |
| 2012/0100722 A1* | 4/2012 | Asai | C23C 16/08 438/758 |
| 2013/0017628 A1* | 1/2013 | Kosugi | H01L 21/67248 438/14 |
| 2014/0120636 A1* | 5/2014 | Yamaguchi | H01L 21/67248 438/5 |
| 2015/0020979 A1* | 1/2015 | Maeda | C09J 5/06 156/711 |
| 2015/0064933 A1* | 3/2015 | Sharma | H01L 21/67248 438/795 |
| 2015/0206786 A1* | 7/2015 | Serebryanov | H01L 21/67115 438/795 |
| 2015/0371881 A1* | 12/2015 | Du Bois | H01L 21/67248 374/141 |
| 2016/0093521 A1* | 3/2016 | Du Bois | C23C 16/4585 438/795 |
| 2016/0172218 A1* | 6/2016 | Mizuta | H01L 21/67109 438/795 |
| 2017/0194174 A1* | 7/2017 | Janakiraman | H01L 23/552 |
| 2017/0215230 A1* | 7/2017 | Parkhe | H05B 1/0233 |
| 2018/0164689 A1* | 6/2018 | Sano | H01L 21/67017 |
| 2019/0006208 A1* | 1/2019 | Maki | H01L 21/67103 |

* cited by examiner

SYSTEM AND METHOD FOR HEAT TREATMENT OF SUBSTRATES

CROSS-REFERENCE TO RELATED APPLICATIONS

The present application claims priority to U.S. Provisional Patent Application Ser. No. 62/450,622, filed Jan. 26, 2017, the entirety of which is incorporated herein by reference.

BACKGROUND

The use of spin coating of polymers is widespread in the semiconductor industry. Generally, substrates are treated by applying a quantity of polymer to the top side of the wafer while the bottom side is adhered by vacuum to a rotatable vacuum chuck. The wafer is spun at a relatively high speed and excess polymer is spun off the wafer leaving a relatively thin film of polymer on the top of the wafer. After the substrate is coated it is necessary to heat the substrate to drive off most of the solvent part of the polymer formulation. This heating step is generally referred to as the Post Apply Bake (PAB). The substrate is then exposed to light generally at wavelengths equal to or less than 400 nanometers creating defined patterns that enable the building of the circuits that ultimately constitute the product and its function. Subsequent to the exposure and depending upon the chemical composition and type of polymer the substrate is once again heat treated in what is generally referred to as the Post Expose Bake (PEB). The substrate is then subjected to various chemistries depending again upon the chemical composition and type of polymer. After the develop step the substrates may again be heat treated in what is generally referred to as the Post Develop Bake (PDB). In the prior art the means of heating has been heated plates in individual chambers.

Recently it has become necessary that these photolithographic steps be carried out on reconstituted substrates or panels. The substrates have imbedded silicon devices generally with a matrix of plastic, which is most often epoxy. Owing to the instability of the plastic and the embedded silicon chips the substrates exhibit much warpage. As much as 10 millimeters of warpage on a 300 mm diameter substrate may occur. Because a hot plate heats by both radiation and natural convection and the substrate is not flat when heated on a hot plate, the temperature uniformity is not good. One solution is to suck the warped substrate flat on the plate, but this increases cost and complexity. As each hot plate is in its own chamber and the chamber must be accessed by a handling means, a door or cover member must be opened to each individual chamber, which not only occupies space but also increases cost and complexity. Furthermore, some of the heat treatment processes are lengthy necessitating a multiplicity of such hot plate chambers further increasing the overall cost and complexity of the machines performing the desired process.

BRIEF SUMMARY

The present invention is directed to a system and/or method for heat treatment of substrates. The system includes a housing that defines a heating chamber and a door assembly that encloses an opening of the heating chamber. The door assembly may be opened and closed. When opened, the door assembly defines a loading slot for loading substrates into and unloading substrates from the heating chamber. The door assembly is coupled to a first actuator and a control unit is coupled to the actuator to move the door assembly between a plurality of loading positions. The system may also include a loading assembly mounted to the door assembly to facilitate insertion and removal of substrates from the heating chamber.

In one aspect, the invention may be a system for heat treatment of substrates comprising: a housing defining a heating chamber having an opening; a door-assembly enclosing the opening of the heating chamber, the door-assembly alterable between: (1) an open state in which a loading slot is formed through the door-assembly, the loading slot forming a passageway into the heating chamber for loading and unloading substrates from the heating chamber; and (2) a closed state in which the loading slot is closed; a first actuator unit operably coupled to the door-assembly; and a control unit operably coupled to the first actuator unit to move the door-assembly relative to the housing between a plurality of loading positions using the first actuator unit so that, for each of the plurality of loading positions, the loading slot is aligned with a different portion of the heating chamber when the door-assembly is in the open state.

In another aspect, the invention may be an apparatus for heat treatment of substrates comprising: a housing defining a heating chamber having an open front end; a door-assembly enclosing the open front end of the heating chamber, the door-assembly alterable between: (1) an open state in which a loading slot is formed through the door-assembly, the loading slot forming a passageway into the heating chamber for loading and unloading substrates from the heating chamber; and (2) a closed state in which the loading slot is closed; and the door-assembly configured to be movable relative to the housing to adjust position of the loading slot relative to the heating chamber.

In yet another aspect, the invention may be a system for heat treatment of substrates comprising: a housing defining a heating chamber having an opening; a door-assembly enclosing the opening of the heating chamber, the door-assembly comprising a loading slot through which substrates can be passed into and out of the heating chamber; a loading assembly mounted to the door assembly, the loading assembly comprising a support member having a chuck configured to hold a substrate, the loading assembly configured to load and unload substrates from the heating chamber via the loading slot; a first actuator unit operably coupled to the door-assembly; a control unit operably coupled to the first actuator unit to move the door-assembly and the loading assembly relative to the housing between a plurality of loading positions using the first actuator unit so that, for each of the plurality of loading positions, the loading slot is aligned with a different portion of the heating chamber.

In still another aspect, the invention may be a method of processing substrates comprising: a) providing a housing defining a heating chamber having an opening and a door assembly enclosing the opening of the heating chamber, the heating chamber comprising a plurality of substrate processing zones; b) moving the door assembly relative to the housing until the door assembly is at a selected one of a plurality of loading positions, each of the plurality of loading positions corresponding to a different one of the substrate processing zones; c) opening a loading slot of the door assembly, the loading slot forming a passageway into the substrate processing zone of the heating chamber that corresponds to the selected loading position; and d) inserting a substrate into the substrate processing zone of the heating chamber that corresponds to the selected loading position via the loading slot.

In a further aspect, the invention may be a method of processing substrates comprising: a) providing a housing defining a heating chamber having an opening, a door assembly enclosing the opening of the heating chamber, and a loading assembly mounted to the door assembly, the heating chamber comprising a plurality of substrate processing zones; b) positioning the substrate on a chuck of the loading assembly; c) moving, in tandem, the door assembly and the loading assembly relative to the housing until the door assembly is at a selected one of a plurality of loading positions, each of the plurality of loading positions corresponding to a different one of the substrate processing zones; and d) inserting the substrate into the substrate processing zone of the heating chamber that corresponds to the selected loading position via a loading slot.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

Figure 1:
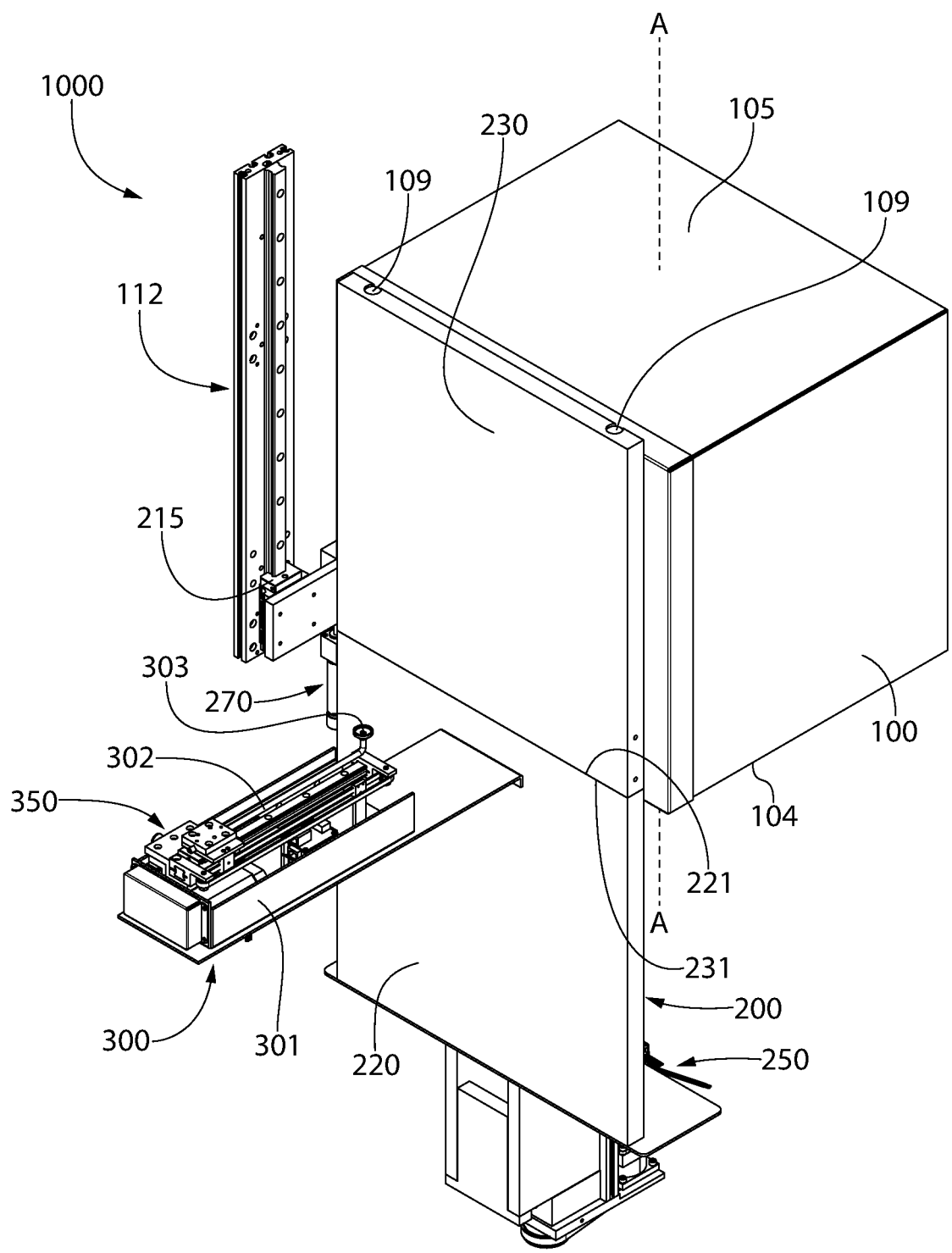
FIG. 1 is a front right perspective view of a system for heat treatment of substrates including a housing defining a heating chamber and a door assembly that encloses an opening of the heating chamber.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Figure 2:
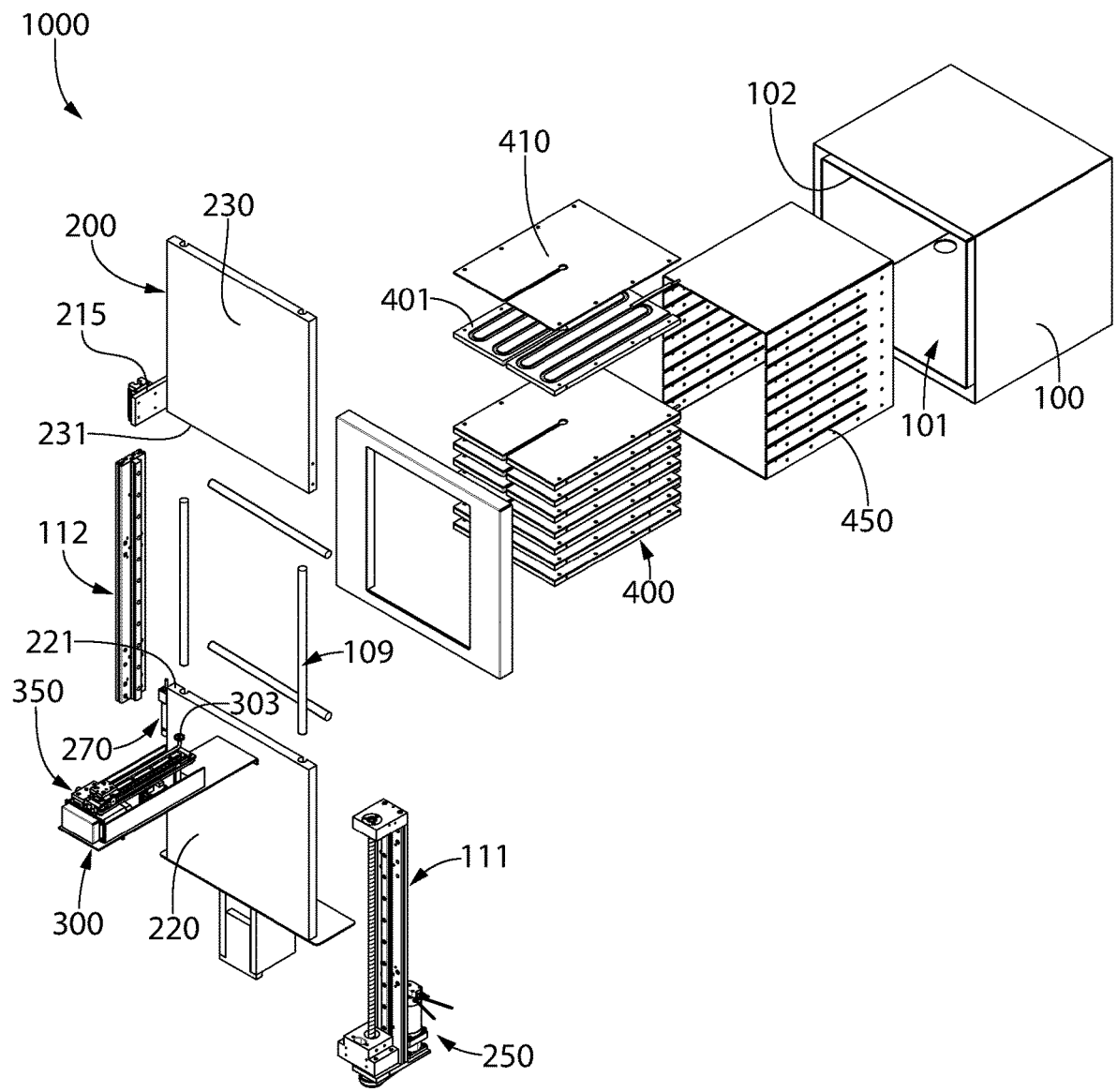
FIG. 2 is an exploded view of the system of FIG. 1.
Figure 3:
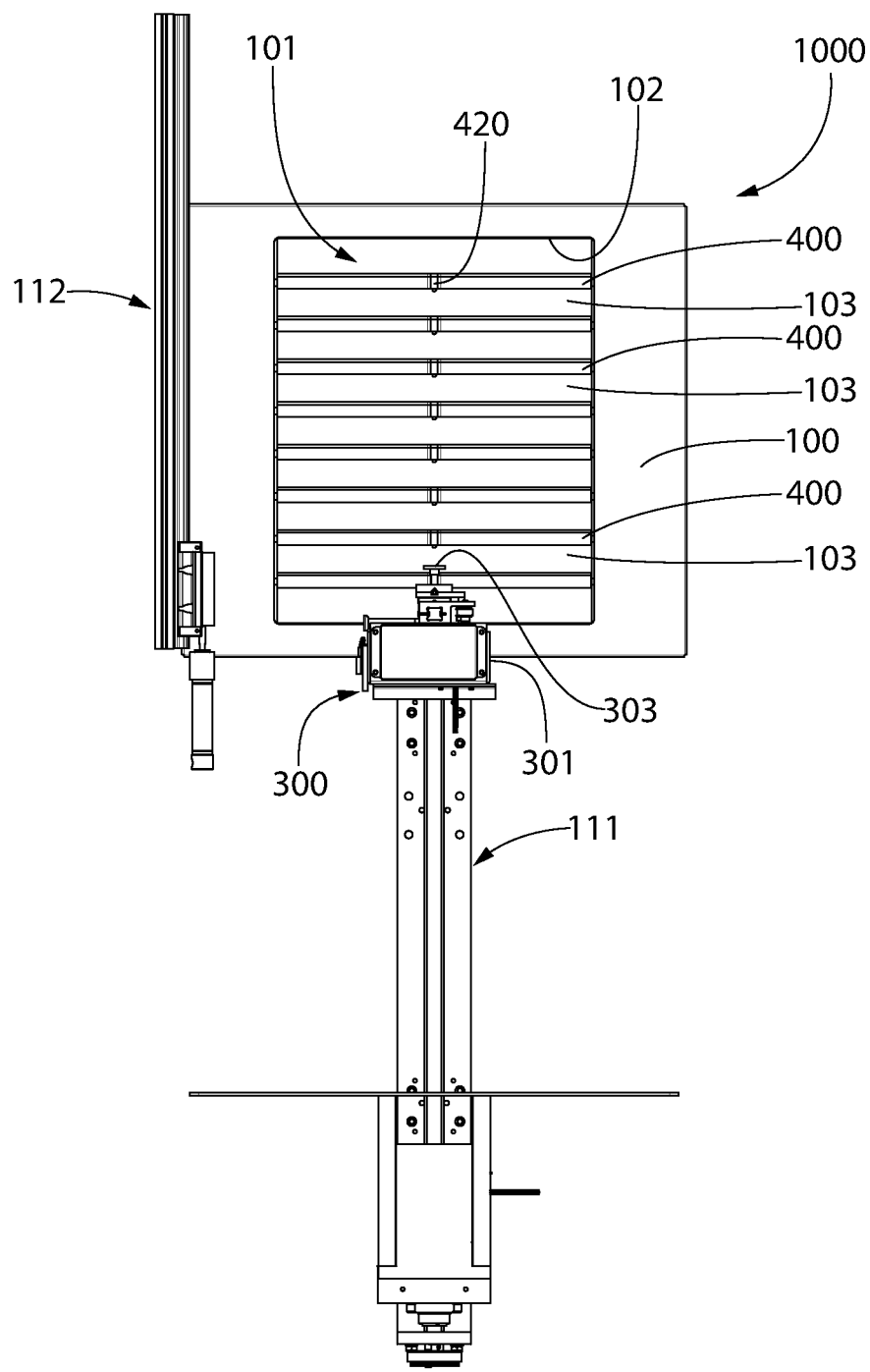
FIG. 3 is a front view of the system of FIG. 1 with the door assembly removed from the housing, illustrating a heating chamber and a plurality of partitions located in the heating chamber.

Referring to FIGS. 1-3, a system 1000 for heat treatment of substrates is illustrated. The substrates described herein may be those that are used in the semiconductor industry and may be described herein as semiconductor wafers or simply wafers, raw silicon substrates, flat articles, panels, or the like. Typically, the substrate is a flat article used in the fabrication of an integrated circuit, although the invention is not to be so limited in all embodiments. Such substrates may be formed from a thin slice of a semiconductor material, such as a crystalline silicon. Such substrates may require heat treatment at various stages of the processing of those substrates and the system 1000 described herein is configured to perform such heat treatment of the substrates.

Thus, the system 1000 described herein is generally designed to heat the substrates during processing (photolithographic or otherwise) of the substrate. Such heat treatment may take place as a Post Apply Bake, a Post Expose Bake, a Post Develop Bake, or other heat treatment as may be desired or necessary for the particular substrate being processed. More generally, the system 1000 may be used during any procedure by which it is desired to treat a substrate with heat. In some embodiments, the system 1000 is intended to operate autonomously without operator intervention. Specifically, in the exemplified embodiment the entire process of loading the substrates into the heat treatment chamber and removing the substrates from the heat treatment chamber when they are sufficiently baked can be accomplished automatically without an operator. Of course, an operator may assist in carrying out some steps in the processes described herein in alternative embodiments.

In certain situations, the bake time for substrates may be quite long. For example, in back-end-of-line processing with thick resists, the time required to adequately bake the substrate is long. As a result, prior heat treatment ovens having a single chamber are undesirable because the number of substrates that can be baked over a set period of time is significantly reduced. In such situations, multiple ovens are needed which, as noted above, increases the overall cost. Thus, the system 100 of the present invention uses a single oven or housing having multiple substrate processing zones such that multiple substrates can be baked simultaneously. Furthermore, because of the manner in which the oven is opened to load and unload the substrates, the loading and unloading does not negatively impact the temperature in the oven. This will be better understood from the description below.

The system 1000 generally comprises a housing 100 defining a heating chamber 101 having an opening 102 and a door assembly 200 enclosing the opening 102 of the heating chamber 101. In the exemplified embodiment the housing 100 is box-shaped, but the invention is not to be so limited and the housing 100 may be cylindrical, elliptical, or any other shape. The housing 100 extends from a bottom end 104 to a top end 105 along a longitudinal axis A-A. A plurality of partitions 400 are located within the heating chamber 101 to separate the heating chamber 101 into a plurality of substrate processing zones 103. Specifically, the space between adjacently positioned partitions 400 each form a substrate processing zone 103, which is a region or portion of the heating chamber 101 within which the substrates are processed or treated with heat. In the exemplified embodiment, the system 1000 includes a support casing 450 that is located within the heating chamber 101 of the housing 100 and the partitions 400 are coupled directly to the support casing 450. However, the support casing 450 may be omitted in some embodiments and the partitions 400 may be coupled directly to the housing 100. The partitions 400 function as support plates that hold and support the substrates when the substrates are located within the heating chamber 101. Specifically, the substrates are loaded into the heating chamber 101 and rest atop of one of the partitions 400. In some embodiments, the partitions 400 may comprise a heating source such that the partitions 400 function to heat the substrates, one example of which will be described with reference to FIG. 4.

The door assembly 200 is movable relative to the housing 100 in a direction parallel to the longitudinal axis A-A of the housing. Specifically, FIG. 1 illustrates the door assembly 200 in a first position relative to the housing 100. The door assembly 200 can be moved upwardly from the position shown in FIG. 1 relative to the housing 100 in the direction of the longitudinal axis A-A while still covering the opening 102 of the heating chamber 101. Specifically, as can be seen in FIG. 1, a first portion of the door assembly 200 is covering the opening 102 and a second portion of the door assembly 200 extends below the bottom end 104 of the housing 100. The door assembly 200 can be moved upwardly so that parts of the first portion of the door assembly 200 extend above the top end 105 of the housing 100, parts of the second portion of the door assembly 200 extend below the bottom end 104 of the housing 100, and the remaining parts of the first and second portions of the door assembly 200 cover the opening 102 of the heating chamber 101 (compare FIGS. 17 and 18, which illustrate the door assembly 200 in two different positions relative to the housing 100). The door assembly 200 is movable relative to the housing 100 between a plurality of loading positions such that at each loading position a substrate can be loaded into a different portion (or a different substrate processing zone) of the heating chamber 101, as will be better understood from the description below.

In the exemplified embodiment, the door assembly 200 comprises a first door 220 and a second door 230. In the exemplified embodiment, the second door 230 is located above the first door 220. Furthermore, in the exemplified embodiment the first and second doors 220, 230 are coplanar, although this is not required in all embodiments and alternative embodiments may exist whereby the first and second doors 220, 230 are not coplanar. As discussed above, the door assembly 200 is movable relative to the housing 100. In the exemplified embodiment the first and second doors 220, 230 move together, in tandem (the same distance and direction at the same time), relative to the housing 100. This occurs because in the exemplified embodiment the second door 230 is gravity biased into contact with the first door 220. Thus, the axial position of the second door 230 is dictated by the axial position of the first door 220. Specifically, because the second door 230 is gravity biased into contact with the first door 220, as the first door 220 moves the second door 230 must also move.

Figure 9:
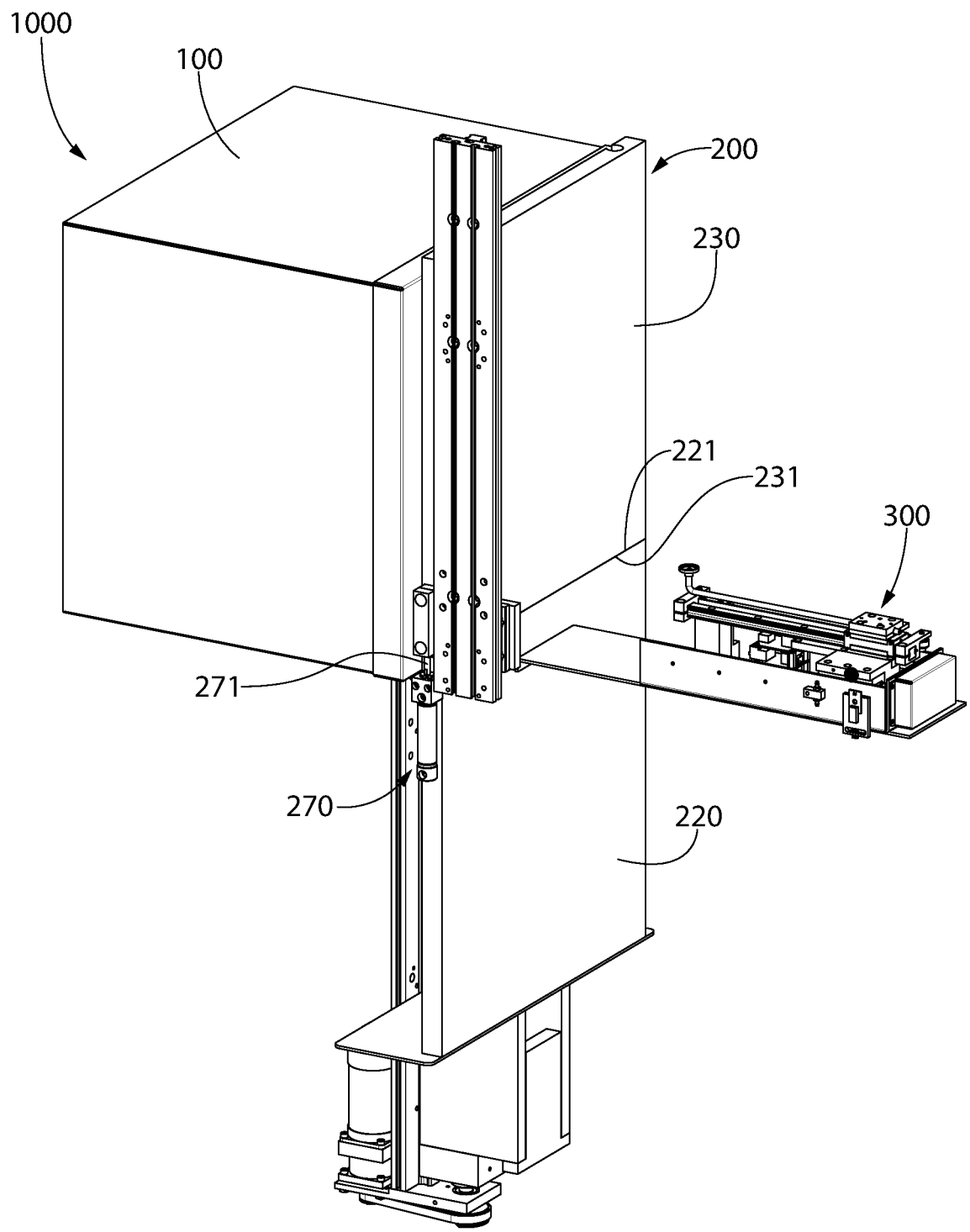
FIG. 9 is a front left perspective view of the system of FIG. 1 with a door assembly in a closed state.
Figure 10:
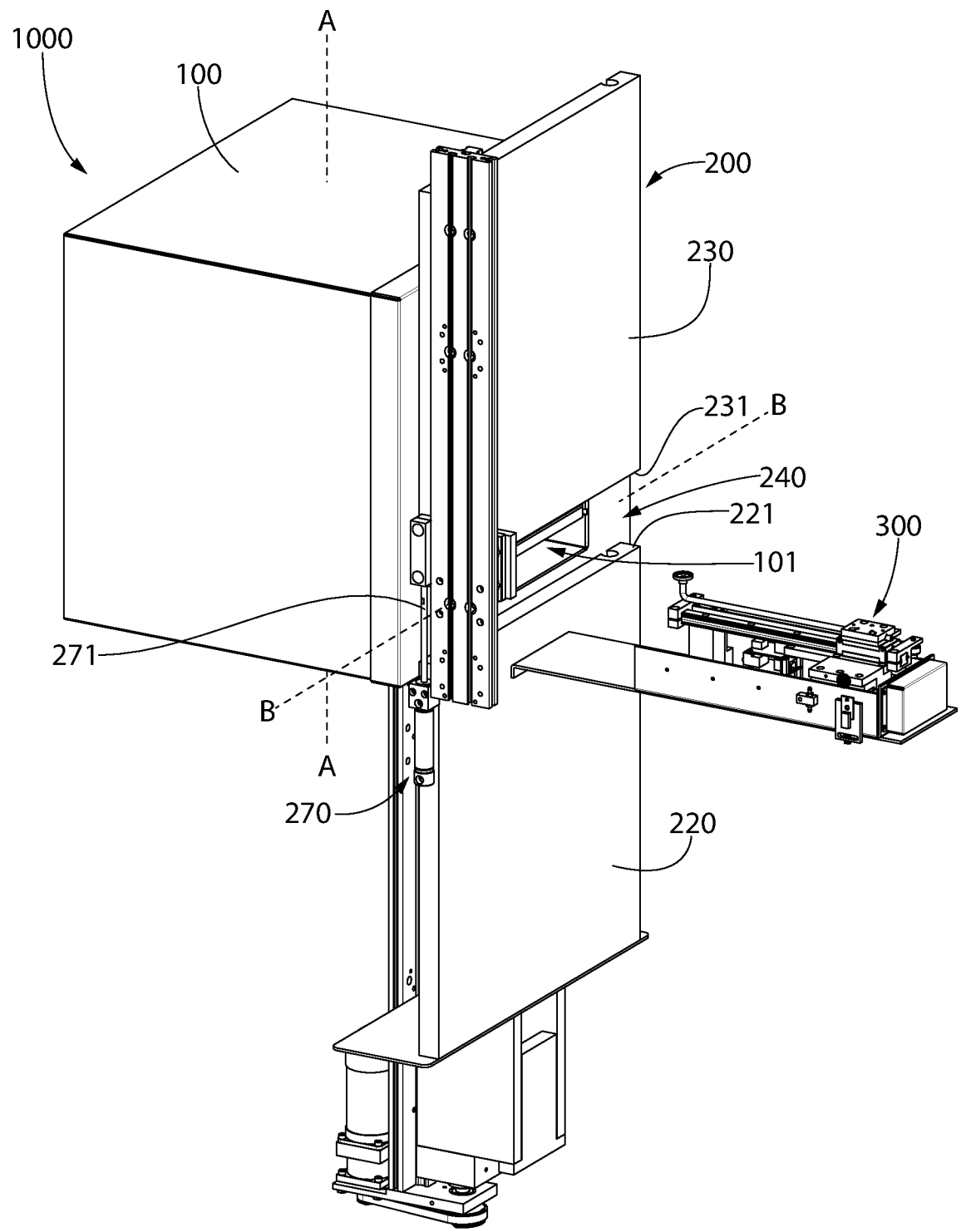
FIG. 10 is a front left perspective view of the system of FIG. 1 with the door assembly in an open state and the loading assembly in a second state with a chuck thereof located outside of the heating chamber.

In addition to movement of the first and second doors 220, 230 in tandem relative to the housing 100, the first and second doors 220, 230 are also movable relative to one another between a contact state (i.e., the closed state of the door assembly, FIG. 9) and a separated state (i.e., an open state of the door assembly 200, FIG. 10). In the contact state, an edge 231 of the second door 230 abuts an edge 221 of the first door 220 (see FIG. 9). In the separated state, the edge 231 of the second door 230 is spaced apart from the edge 221 of the first door 220, thereby at least partially defining a loading slot 240 between the edges 221, 231 of the first and second doors 220, 230 to achieve the open state (see FIG. 10). In the exemplified embodiment, the movement of the first and second doors 220, 230 relative to each other is achieved by a second actuation unit 270, described in more detail below with reference to FIGS. 9 and 10.

The system 1000 comprises a first rail member 111 and a second rail member 112. The door assembly 200 is operably coupled to the first and second rail members 111, 112 to facilitate movement of the door assembly 200 while preventing the door assembly 200 from rattling during such movement. Specifically, the first door 220 is coupled to the first rail member 111 by a first clamp member 214 (FIGS. 5 and 6) and the second door 230 is coupled to the second rail member 112 by a second clamp member 215.

The system 1000 also comprises a plurality of inflatable tubes 109 that are coupled to the inner surface of the door assembly 200. The inflatable tubes 109 may be formed from rubber (e.g., silicone rubber or the like). The inflatable tubes 109 may be inflated when the door assembly 200 is not moving to create a seal between the door assembly 200 and the housing 100, thereby sealing the opening 102 of the heating chamber 101 and preventing heat from escaping the heating chamber 101. Furthermore, the inflatable tubes 109 may be deflated when it is desired to move the door assembly 200. In that regard, the inflatable tubes 109 may be operably coupled to a control unit (such as control unit 500 described below) and to a source of air and a source of vacuum or suction to control and facilitate inflating and deflating thereof.

In the exemplified embodiment, the door assembly 200 can be opened and closed and moved upwardly and downwardly relative to the housing 100 to align the loading slot 240 (when the door assembly 200 is in the open state) with different portions of the heating chamber 101 for purposes of loading substrates into and unloading substrates from the heating chamber 101. Specifically, in the exemplified embodiment the door assembly 200 translates upwardly and downwardly in a direction substantially parallel to the longitudinal axis A-A of the housing 100. In the exemplified embodiment, the longitudinal axis A-A is vertically oriented.

Although in the exemplified embodiment the door assembly 200 is described and illustrated as moving upwardly and downwardly relative to the housing 200, in other embodiments the door assembly 200 may move left to right relative to the housing 200 (i.e., substantially perpendicular to the longitudinal axis A-A of the housing 100), may rotate relative to the housing 100, or may have other degrees of movement depending on the orientation and positioning of the partitions 400 and the orientation at which substrates are to be loaded into the heating chamber 101. Furthermore, in the exemplified embodiment the system 1000 comprises a loading assembly 300 that is mounted to the door assembly 200. Because the loading assembly 300 is mounted to the door assembly 200, in the exemplified embodiment the loading assembly 300 moves in tandem with the door assembly 200 when the door assembly 200 is moved as described herein. Specifically, if the door assembly 200 moves upwardly six inches, the loading assembly 300 will similarly move upwardly six inches. The loading assembly 300 can also be moved, separately from the movement of the door assembly 200, between various states as described herein below to facilitate loading and unloading of substrates from the heating chamber 101. Specifically, when the door assembly 200 is static and in the open state, the loading assembly 300 can be actuated to move a chuck 302 of the loading assembly 300 into and out of the heating chamber 101 via the loading slot 240 in the door assembly 200.

Figure 8:
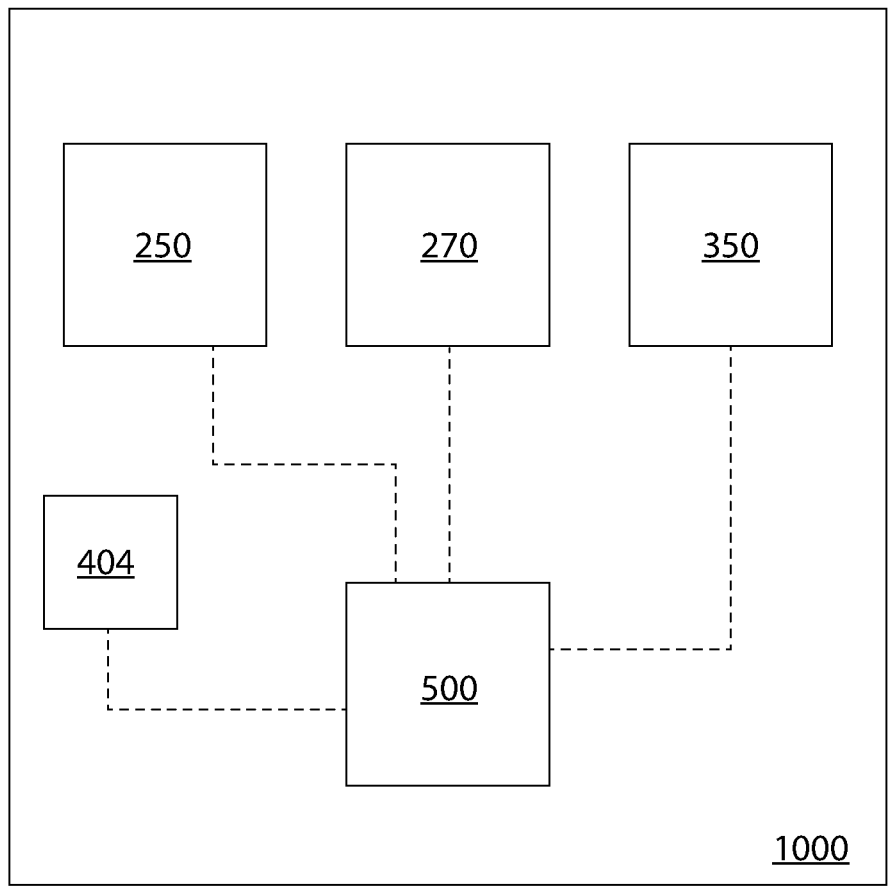
FIG. 8 is an electrical schematic illustrating operable coupling between a control unit and first, second, and third actuator units.

Referring to FIGS. 1, 2, and 8 concurrently, the relationship between a control unit 500 and various actuator units that control the movement of the various moving components of the system 1000 will be described. The movement of the door assembly 200 is controlled by a first actuator unit 250. The opening and closing of the door assembly 200 is controlled by the second actuator unit 270. The movement of the loading assembly 300 is controlled by a third actuator unit 350. Specifically, each of the first, second, and third actuator units 250, 270, 350 is operably coupled to the control unit 500. Thus, the control unit 500 is operably coupled to the first actuator unit 250 to move the door assembly 200 relative to the housing 100 between a plurality of loading positions using the first actuator unit 250. The control unit 500 is operably coupled to the second actuator unit 270 to alter the door assembly 200 between an open state and a closed state using the second actuator unit 270. Finally, the control unit 500 is operably coupled to the third actuator unit 350 to alter the loading assembly 300, using the third actuator unit 350, between first and second states to load and unload substrates from the heating chamber 101 via the loading slot 240 in the door assembly 200 when the door assembly 200 is in the open state. The details of these movements of the various components will be described more fully below.

The control unit 500 may in some embodiments comprise a processor and a memory device. The processor and memory device may be separate components, or the memory device may be integrated with the processor within the control unit 500. Furthermore, the control unit 500 may include only one processor and one memory device, or it may include multiple processors and multiple memory devices. The processor of the control unit 500 may be any computer or central processing unit (CPU), microprocessor, micro-controller, computational device, or circuit configured for executing some or all of the processes described herein, including without limitation: (1) activation and deactivation of the first, second, and third actuator units 250, 270, 350; (2) activation and deactivation of a heating source that heats the heating chamber; and (3) inflating and deflating the inflatable tubes 109.

The memory device of the control unit 500 may include, without limitation, any suitable volatile or non-volatile memory including random access memory (RAM) and various types thereof, read-only memory (ROM) and various types thereof, USB flash memory, and magnetic or optical data storage devices (e.g. internal/external hard disks, floppy discs, magnetic tape CD-ROM, DVD-ROM, optical disk, ZIP™ drive, Blu-ray disk, and others), which may be written to and/or read by the processor which is operably connected thereto. The memory device may store algorithms and/or calculations that can be used (by the processor) to determine when to activate/deactivate the various actuator units 250, 270, 350 and activate/deactivate the heating source of the system 1000 described herein.

Figure 4:
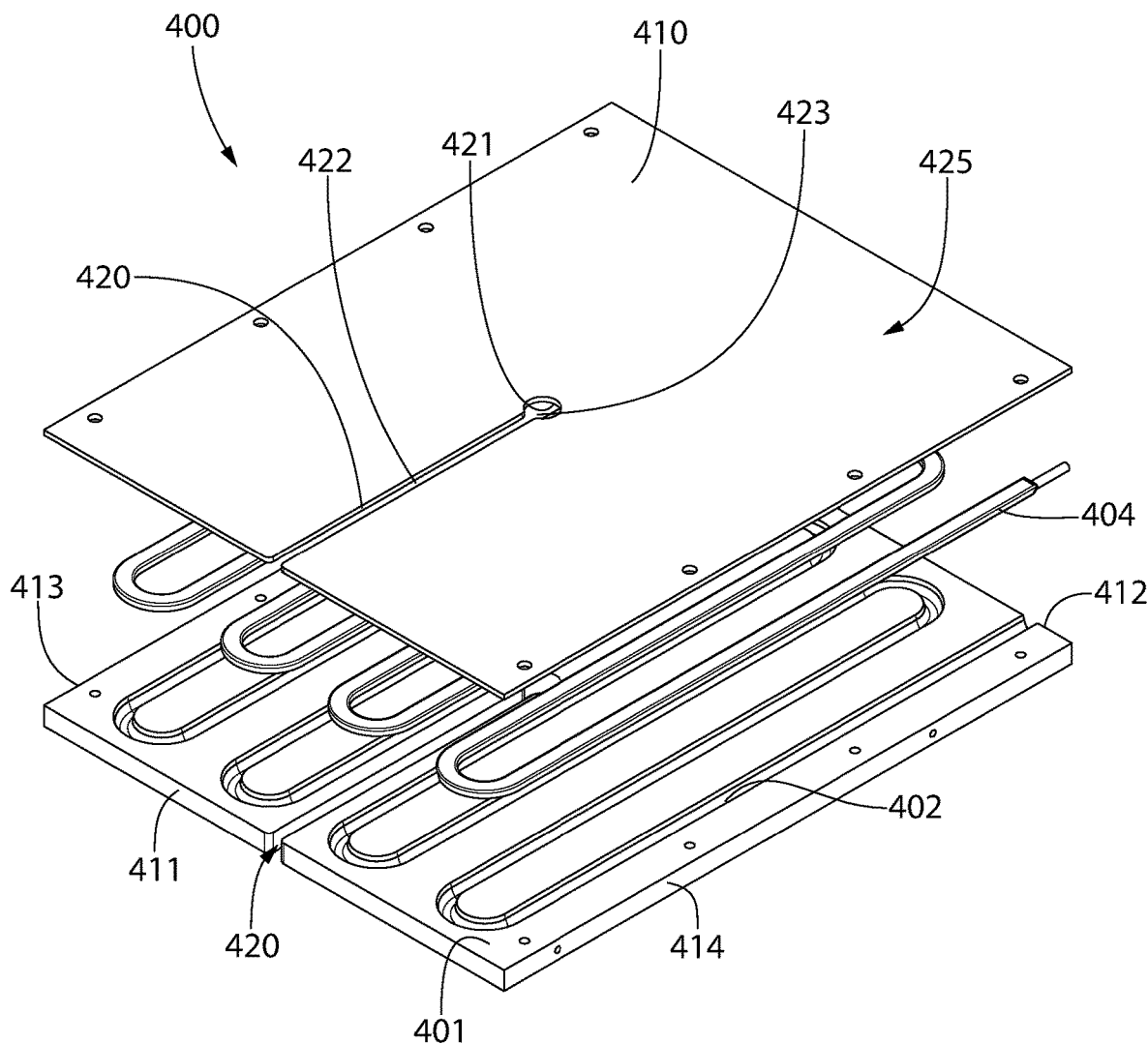
FIG. 4 is an exploded view of one of the partitions of the system of FIG. 1.

Referring to FIGS. 2-4, the partitions 400 will be described in detail. In the exemplified embodiment, a plurality of the partitions 400 are positioned within the heating chamber 101 in a substantially horizontal orientation to separate the heating chamber 101 into the plurality of substrate processing zones 103. Of course, the invention is not to be so limited and the partitions 400 may be oriented at an incline relative to the longitudinal axis A-A or they may even be oriented vertically rather than horizontally in various alternative embodiments. In the exemplified embodiment the partitions 400 are horizontally oriented and stacked in a vertically spaced apart manner. Thus, in the exemplified embodiment the substrate processing zones 103 are a plurality of vertically-stacked substrate processing zones that are separated from one another by the horizontally oriented partitions 400 (i.e., the spaces between the partitions 400 form the substrate processing zones 103). As noted above, the partitions 400 serve as support plates that hold and support the substrates as the substrates are being heated in the heating chamber 101. Specifically, the partitions 400 hold the substrates such that one or more substrates may be positioned within each substrate processing zone 103 during a heat treatment procedure.

In the exemplified embodiment, each of the partitions 400 comprises a heating plate 401 and a cover plate 410 that is coupled to the heating plate 401. In the exemplified embodiment, the heating plate 401 comprises a serpentine shaped channel 402 within which a heating source 404 is disposed. Of course, the channel 402 may take on shapes that are other than that which is shown in the drawings and the invention is not limited to a serpentine shaped channel 402 in all embodiments. The cover plate 410 covers a top surface of the heating plate 401 and closes an open top end of the channel 402 of the heating plate 401 so that the heating source 404 is sandwiched between the heating plate 401 and the cover plate 410 of the partition 400. The substrates lie atop an upper surface 425 of the cover plate 410 during heat treatment of the substrates.

In the exemplified embodiment the heating source 404 is an electrical heating element (such as a tube-type electrical heater) having the same shape as the serpentine shaped channel 402 in the heating plate 401 of the partition 400. However, alternative embodiments are possible such as, for example without limitation, the heating source 404 being a heated fluid that flows through the serpentine shaped channel 402 of the partitions 400. Furthermore, in still other embodiments the partitions 400 may not comprise heating elements at all. Rather, in other embodiments the housing 100 may comprise openings in its sidewalls for the injection and removal of a heated gas (such as air, Nitrogen, or the like) through the heated chamber 101. In such an embodiment, the heated gas may pass into the heated chamber 101 from one side thereof, flow over and all around the substrates located within the heated chamber 101, and then flow out of the heated chamber 101 via an opposite side thereof. In other embodiments still, electrical heaters may be located within the heating chamber 101 separate from the partitions 400. In some embodiments, the system 1000 may include both partitions 400 comprising heating elements 404 and the flow of heated gas through the heating chamber 101 for heat treatment of substrates.

Although not shown in the exemplified embodiment, the partitions 400 may also comprise a plurality of substrate support elements protruding from the cover plate 410. In such embodiments, the substrates may rest directly atop of the substrate support elements rather than resting directly atop the upper surface 425 of the cover plate 410. This may be specifically desirable in embodiments that use forced air heating to ensure that the heated gas can flow all around the substrate to apply heat to all surfaces of the substrate.

In the exemplified embodiment, the heating source 404 is operably coupled to the control unit 500 as shown in FIG. 8. The heating source 404 may be powered by the control unit 500 or by a separate power source. Based on algorithms pre-stored within the control unit 500 or via manual activation by an operator, the heating source 404 may be activated and deactivated and otherwise adjusted as needed (such as temperature adjustments or the like) to achieve acceptable levels of heat within the heating chamber 101 during a heat treatment procedure. Each partition 400 may comprise a different heating source 404, and the heating source 404 within each partition 400 may be separately actuatable by the control unit 500. Thus, if a substrate is located on a particular partition 400, the heating source 404 of that partition 400 may be activated whereas the heating sources 404 of partitions 400 that do not have a substrate thereon will not be activated. In some embodiments, the heating sources 404 may be activated automatically upon a substrate being supported by a respective partition 400.

Thus, because in the exemplified embodiment the substrates rest atop the partitions 400, and more specifically atop the cover plate 410 of the partitions 400, heating is achieved due to the contact between the substrates and the partitions 400 via thermal conduction and/or radiation. Although in the exemplified embodiment the partitions 400 comprise the heating source 400, in other embodiments the partitions 400 may simply be support plates for supporting the substrates when the substrates are located within the heating chamber 101 without the partitions 400 being heated or comprising any heating elements.

The partition 400 comprises a front edge 411, a rear edge 412 opposite the front edge 411, a first side edge 413, and a second side edge 414 opposite the first side edge 413, each of the first and second side edges 413 414 extending between the front and rear edges 411, 412. Thus, in the exemplified embodiment the partition 400 is square or rectangular shaped. However, the invention is not to be so limited and the partition 400 may be any polygonal shape, or it may be in the shape of a circle. The shape of the partition 400 may be dictated, at least in part, by the shape of the heating chamber 101 of the housing 100.

In the exemplified embodiment, the partition 400 comprises an elongated slot 420 extending from the front edge 411 of the partition 400 towards the rear edge 412 of the partition 400. Of course, where the partition 400 is non-rectangular, the elongated slot 420 merely extends from the portion of the partition 400 that is adjacent to the opening 102 of the heating chamber 101 towards a portion of the partition 400 that is adjacent a rear portion of the heating chamber 101 that is located opposite the opening 102. In the exemplified embodiment, the elongated slot 420 does not extend along the entirety of the partition 400 from the front edge 411 to the rear edge 412, but rather a terminal end 421 of the elongated slot 420 is spaced from the rear edge 412 of the partition 400. In alternative embodiments, each partition 400 may comprise two separate partition segments that are positioned within the heating chamber 101 in a horizontally spaced apart and axially aligned manner, thereby forming an elongated slot between the two separate partition segments of each partition 400. Thus, instead of the partition 400 being formed as a singular component with a slot therein, the partition 400 may comprise two components that are spaced apart, effectively achieving the same structure. As can be seen in FIG. 4, the elongated slot 420 is formed into both of the heating plate 401 and the cover plate 410 of the partition 400.

The elongated slot 420 comprises an entry section 422 and a loading section 423. The entry section 422 extends from the front edge 411 of the partition to the loading section 423 and the loading section 423 extends from the entry section 422 to the terminal end 421 of the elongated slot 420. The entry section 422 has a first cross-sectional area and the loading section 423 has a second cross-sectional area, the second cross-sectional area being greater than the first cross-sectional area. In the exemplified embodiment, the entry section 421 is a linear section of the elongated slot 420 and the loading section 423 is circular, although the invention is not to be limited by this specific shape for the loading section 423 in all embodiments and the loading section 423 may take on a polygonal shape in other embodiments. The reason for the difference in cross-sectional area between the entry and loading sections 422, 423 will become apparent from the description of FIGS. 13 and 14, but briefly it is to enable a chuck that holds the substrate to pass through the partition 400 in order to load the substrate onto the partition 400 during a substrate release step or to unload the substrate from the partition 400 during a substrate pick-up step.

When the substrate is loaded on the partition 400, it straddles the elongated slot 420 such that the substrate is located atop of parts of the partition 400 on both opposing sides of the elongated slot 420. Thus, the substrate may pass over and cover at least a portion of the elongated slot 420. In embodiments that include the substrate support elements noted above, there may be substrate support elements located on both opposing sides of the elongated slot 420 to adequately support the substrate as the substrate straddles (or passes over) the elongated slot 420.

Figure 5:
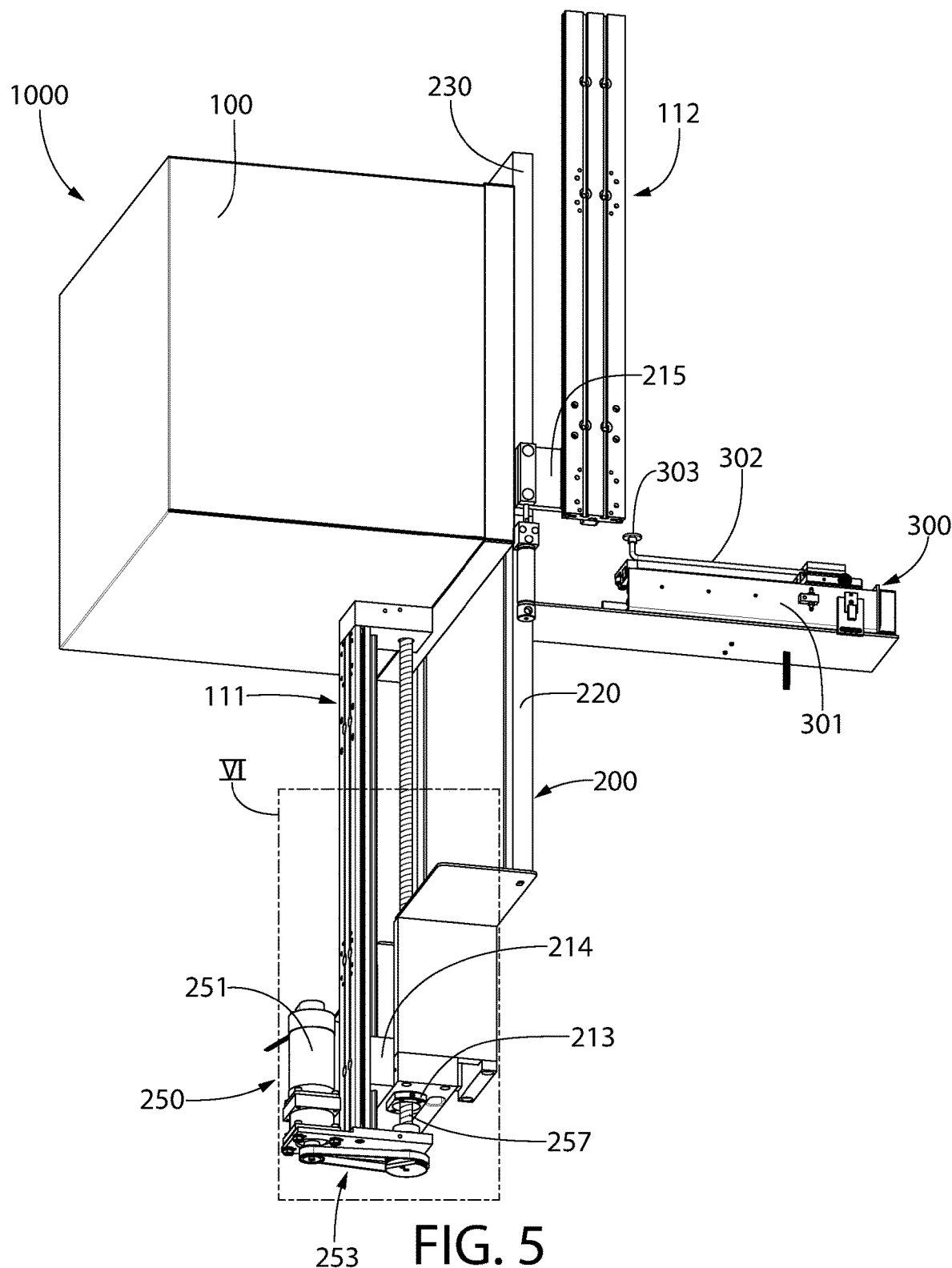
FIG. 5 is a rear left perspective view of the system of FIG. 1.
Figure 6:
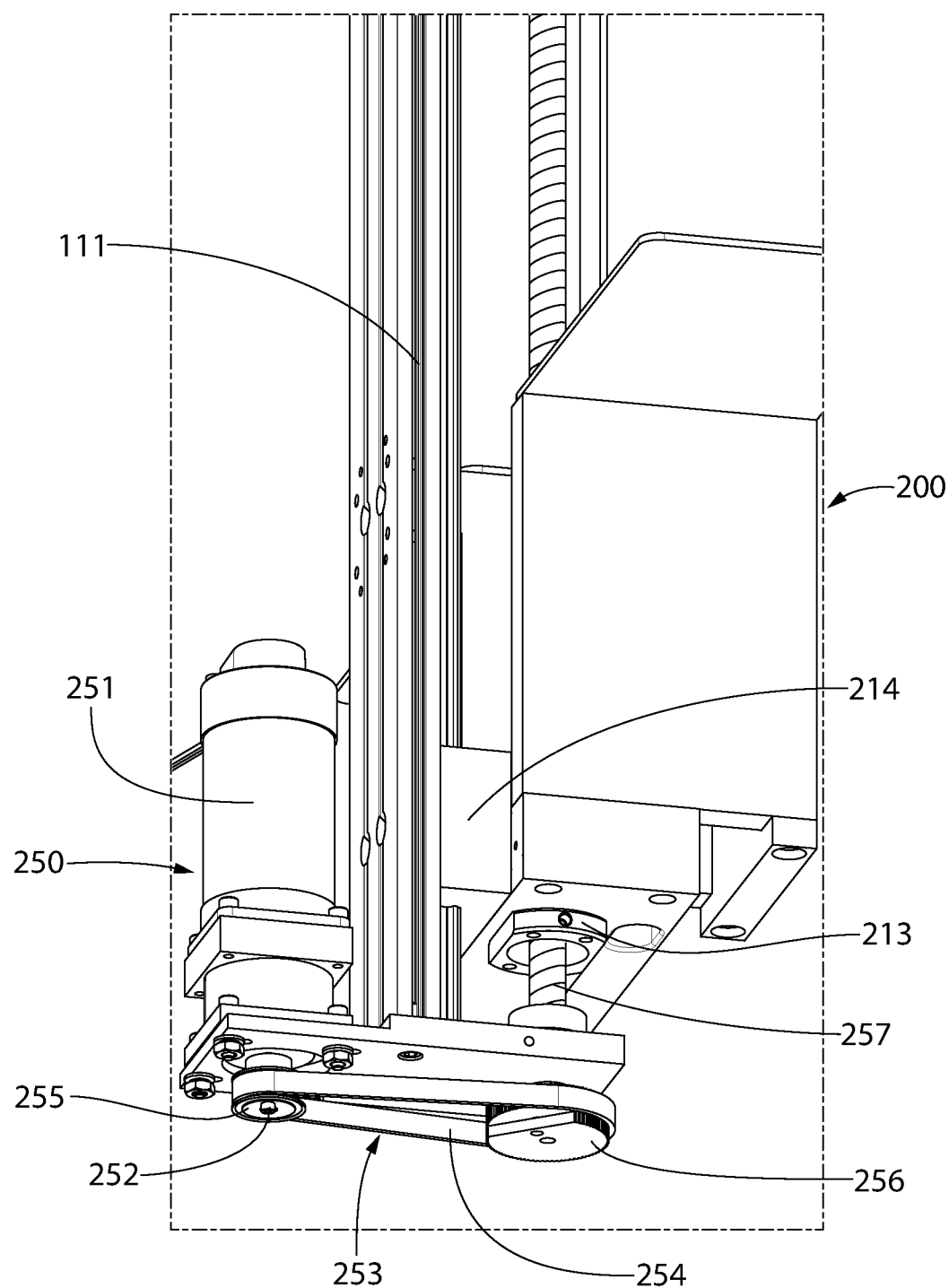
FIG. 6 is a close-up view of area VI of FIG. 5.

Referring to FIGS. 5 and 6, the first actuator unit 250 will be described along with description of the operation of movement of the door assembly 200. The first actuator unit 250 generally comprises a motor 251 having a drive shaft 252, a belt and pulley system 253, and a threaded screw 257. The belt and pulley system 253 comprises a belt 254, a first pulley 255, and a second pulley 256. The drive shaft 252 of the motor 251 is operably coupled to the first pulley 255 and the threaded screw 257 is operably coupled to the second pulley 256. When the motor 251 is activated, the drive shaft 252 rotates, which in turn causes the first pulley 255 to rotate. The belt 254 wraps around the first and second pulleys 255, 256 and thus the rotation of the first pulley 255 causes the second pulley 256 to also rotate, which in turn causes the threaded screw 257 to rotate due to its coupling to the second pulley 256. The door assembly 200 comprises a coupling member 213 having internal threads that mate with the threads of the threaded screw 257. As a result, rotation of the threaded screw 257 as noted above causes the door assembly 200 to translate vertically (upwardly and downwardly depending on the direction of rotation of the motor 251 and the threaded screw 257) in a direction parallel to the longitudinal axis A-A of the housing 100.

The first actuator unit 250 is operably coupled to the door assembly 200 to move the door assembly 200 as described herein. In the exemplified embodiment, the first actuator unit 250 is operably coupled to the first door 220 of the door assembly 200 (via the coupling member 213). However, in other embodiments the first actuator unit 250 may be coupled to the second door 230 of the door assembly 200.

As noted above, in the exemplified embodiment the second door 230 is gravity biased into contact with the first door 220. The second door 230 is coupled to the second rail 112 via the second clamp member 215, but the second door 230 moves when the first door moves via the first actuator unit 250 due to it being gravity biased into contact with the first door 220. Thus, anytime that the first door 220 moves due to activation of the first actuator unit 250, the second door 230 moves the same distance at the same time. The second door 230 can also be moved separately from the first door 220 to form the loading slot 240 due to activation of the second actuator unit 270, as described in more detail below with reference to FIGS. 9 and 10.

Of course, the above is merely one exemplary technique for achieving movement of the door assembly 200. There are many other ways that this can be accomplished, including having the door assembly 200 coupled to a track with interacting features on the track and the door assembly 200 that facilitate movement of the door assembly 200 as described herein. In still other embodiments the door assembly 200 may be translated via a cam-follower mechanism. The invention is not to be particularly limited by the manner in which the door assembly 200 is made to move unless the same is specified in the claims.

As noted above, in the exemplified embodiment the door assembly 200 comprises the first clamp member 214 that is coupled to the first rail 111 and the second clamp member 215 that is coupled to the second rail 112. The first clamp member 214 and the first rail 111 are configured to permit the first clamp member 214 to move along the first rail 111 while remaining coupled to the first rail 111 and the second clamp member 215 and the second rail 112 are configured to permit the second clamp member 215 to move along the second rail 112 while remaining coupled to the second rail 112. Thus, as the door assembly 200 translates in the manner described herein, the clamp member 214 remains coupled to the first rail 111 and rides along the first rail 111 and the second clamp member 215 remains coupled to the second rail 112 and rides along the second rail 112. The first rail 111 and the first clamp member 214 are configured to enable the first clamp member 214 to translate in a direction parallel to the longitudinal axis A-A while remaining coupled to the first rail 111 while preventing the door assembly 200 from substantial degrees of movement in a direction perpendicular to the longitudinal axis A-A. This prevents extraneous movement of the door assembly 200, such as rattling or the like, that might otherwise occur during translation of the door assembly 200. Furthermore, the coupling of the first rail 111 and the first clamp member 214 provides an additional support for the door assembly 200 which may be required depending on the overall weight of the door assembly 200.

Referring to FIGS. 1 and 7A-7C, the loading assembly 300 will be further described. As noted above, in the exemplified embodiment the loading assembly 300 is mounted to the door assembly 200. More specifically, in the exemplified embodiment the loading assembly 300 is mounted directly to the first door 220 of the door assembly 200. Thus, as the door assembly 200, and more specifically the first door 220 of the door assembly 200, translates upwardly and downwardly as described herein, the loading assembly 300 will also translate upwardly and downwardly due to its fixed coupling to the first door 220. This ensures that the loading assembly 300 is always aligned with the loading slot 240 when the door assembly 200 is in the open state so that the loading assembly 300 can quickly load substrates into and unload substrates from the heating chamber 101. Of course, in alternative embodiments the loading assembly 300 may be coupled to the second door 230 instead of the first door 220 without affecting the function of the loading assembly 300.

The loading assembly 300 comprises a chassis 301 and a support member 302 that is supported by the chassis 301. The support member 302 comprises a chuck 303 that is configured to hold a substrate during loading and unloading of the substrate to/from the heating chamber 101 of the housing 100. The chassis 301 is fixedly mounted to the door assembly 200 so that movement of the door assembly 200 by the first actuator 250 results in a corresponding movement of the loading assembly 300. More specifically, in the exemplified embodiment the chassis 301 is fixedly mounted to the first door 220, although it is entirely possible for the chassis 301 (and the loading assembly 300) to be mounted to the second door 230 in other embodiments. Furthermore, in still other embodiments the loading assembly 300 may not be coupled directly to the door assembly 200. However, whether coupled to the door assembly 200 or not, the loading assembly 300 should move in tandem with the door assembly 200 as described herein. For example, it is possible that the door assembly 200 and the loading assembly 300 may both be separately coupled to a movement apparatus that ensures both the door assembly 200 and the loading assembly 300 move in the same manner (i.e., the same degree of movement in the same direction and at the same time) even if the loading assembly 300 is not mounted directly to the door assembly 200.

Figure 7A:
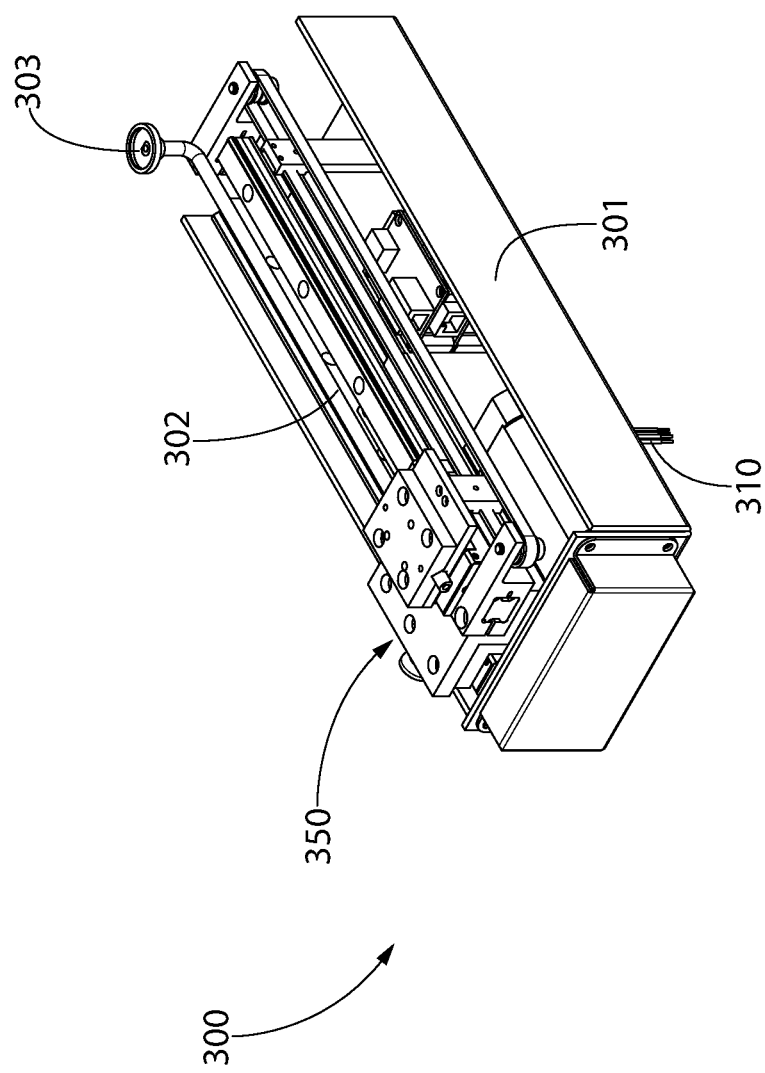
FIG. 7A is a perspective view of a loading assembly of the system of FIG. 1 in an un-actuated state.

As noted previously, the system 1000 also comprises the third actuator unit 350 that is operably coupled to the control unit 500 (FIG. 8) and to the loading assembly 300. The control unit 500 is configured to alter the loading assembly 300 using the third actuator unit 350 between a first state (FIG. 7C) and a second state (FIG. 7A). The third actuator is a linear actuator such that activation of the third actuator unit 350 moves the loading assembly 300 linearly into the heating chamber 101. In the exemplified embodiment, the third actuator unit 350 comprises a dual actuation mechanism such that the third actuator unit 350 can actuate to alter the loading assembly 300 from the state illustrated in FIG. 7A, to the state illustrated in FIG. 7B, to the state illustrated in FIG. 7C.

Figure 7B:
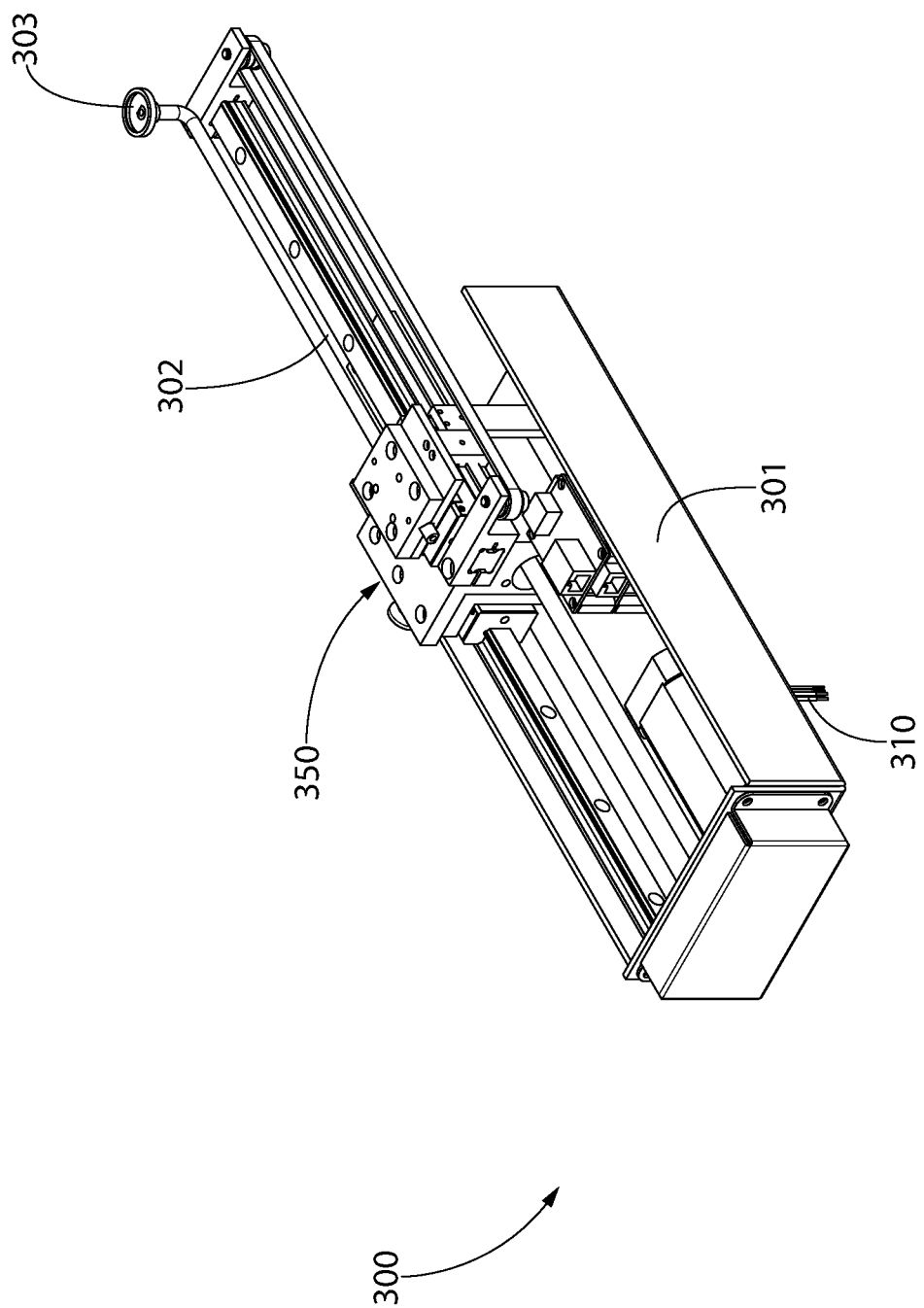
FIG. 7B is a perspective view of the loading assembly of FIG. 7A in a first actuated state.
Figure 7C:
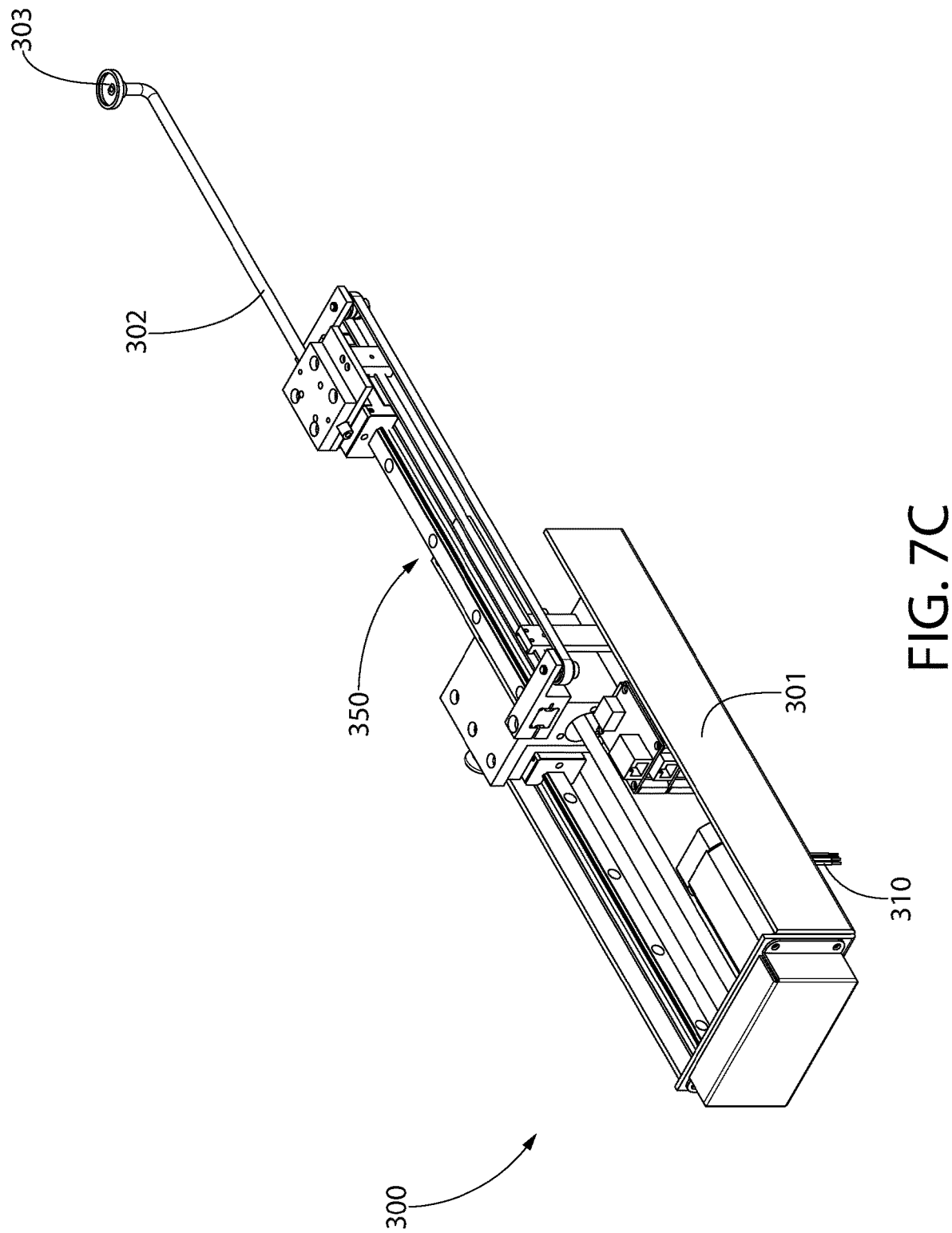
FIG. 7C is a perspective view of the loading assembly of FIG. 7A in a second actuated state.

The third actuator unit 350 may comprise any mechanisms that are capable of achieving the desired linear movement of the support member 302 and chuck 303 of the loading assembly 300. Specifically, the third actuator unit 350 may comprise one or more motors, belt and pulleys, tracks, guides, rails, threaded screws, elevator systems, cam-follower systems, solenoids, pneumatic actuators, or the like that facilitate the desired movement. As will be discussed further below, the loading assembly 300 transitions between the various illustrated states during loading and unloading of substrates from the heating chamber 101. In the exemplified embodiment the support member 302 of the loading assembly 300 moves linearly in a direction that is perpendicular to the longitudinal axis A-A of the housing 100 and also perpendicular to the direction of movement of the door assembly 200. As seen in FIGS. 7A-7C, the loading assembly 300 comprises electrical conductors, such as wires 310, that are configured for operable coupling to the control unit 500 and/or to various other electronic components including a power source, a display, a vacuum source, or the like.

As noted above, the chuck 303 is configured to hold/support a substrate thereon during a loading or unloading operation. In that regard, the chuck 303 may be a suction cup or the like as is standard practice in the art. Furthermore, the chuck 303 may be operably coupled to a source of vacuum so that suction is applied onto a substrate being supported by the chuck 303 to hold the substrate thereon. However, the invention is not to be so limited and the chuck 303 may be any structure that is capable of holding a substrate during a loading or unloading operation. For example, the chuck 303 may be a flat plate the supports a substrate, clamp arms that clamp around the substrate to support it during loading/unloading, or any other structure/device capable of holding of the substrate securely during loading and unloading thereof.

Referring to FIGS. 9 and 10, the altering of the door assembly 200 from the closed state to the open state will be described. FIG. 9 illustrates the door assembly 200 of the exemplified embodiment in the closed state. In this state, the edge 231 (i.e., the lower edge) of the second door 230 is in contact with the edge 221 (i.e., the upper edge) of the first door 220 such that there is no gap or space between the first and second doors 220, 230. In this state, the door assembly 200 completely encloses the opening 102 of the heating chamber 101. Thus, in the closed state heat generated within the heating chamber 101 is able to stay in the heating chamber 101 to perform the heat treatment of the substrates located within the heating chamber 101.

FIG. 10 illustrates the door assembly 200 in the open state. In the open state, a loading slot 240 is formed through the door assembly 200. The loading slot 240 forms a passageway into the heating chamber 101 for loading substrates into and unloading substrates from the heating chamber 101. In the exemplified embodiment, the loading slot 240 is a space or gap that is formed between the first and second doors 220, 230, the loading slot 240 being elongated along a slot axis B-B that is perpendicular to the longitudinal axis A-A of the housing 100. Thus, FIG. 9 illustrates the first and second doors 220, 230 in the contact state by which the edge 231 of the second door 230 abuts the edge 221 of the first door, thereby closing the loading slot 240 to achieve the closed state. FIG. 10 illustrates the first and second doors 220, 230 in the separated state in which the edge 231 of the second door 230 is spaced apart from the edge 221 of the first door 220, thereby at least partially defining the loading slot 240 between the edges 221, 231 of the first and second doors 220, 230 to achieve the open state.

In the exemplified embodiment, the loading slot 240 is formed by moving the second door 230 relative to the first door 220 while the first door remains static. Specifically, to form the loading slot 240 the second door 230 is moved in a direction parallel to the longitudinal axis A-A of the housing A-A while the first door 220 does not move at all. To achieve the open state of the door assembly 200, the second door 230 is moved by the second actuator unit 270. In the exemplified embodiment, the second actuator unit 270 is mounted to the first door 220. However, the invention is not to be so limited and in other embodiments the second actuator unit 270 may be mounted to the second door 230 or to some component that is distinct from the door assembly 200.

The second actuator unit 270 comprises a piston element 271 that is alterable between: (1) a retracted state (FIG. 9) in which the piston element 271 is retracted and allows the first and second doors 220, 230 to assume the contact state; and (2) an extended state (FIG. 10) in which the piston element 271 is extended, thereby creating relative movement between the first and second doors 220, 230 to achieve the separated state. In the exemplified embodiment, the transition of the piston element 271 between the retracted and extended states comprises the piston element 271 moving in a direction parallel to the longitudinal axis A-A of the housing 100. While transitioning from the retracted state to the extended state, the piston element 271 presses on the second door 230 so that as the piston element 271 extends, the second door 230 moves relative to the housing 100 and relative to the first door 220 in a direction parallel to the longitudinal axis A-A of the housing 100. The second actuator unit 270 may be a pneumatic actuator, a solenoid, or any other type of actuator capable of achieving the desired relative movement between the first and second doors 220, 230. For example, in one alternative embodiment the second actuator unit 270 may be a dedicated motor and belt and pulley system that is configured to move the second door 230 without also moving the first door 220 in order to form the loading slot 240.

As stated previously, the second actuator unit 270 is operably coupled to the control unit 500 so that the control unit 500 may control activation of the second actuator unit 270. Specifically, based on algorithms pre-stored in the control unit 500, the control unit 500 will activate the second actuator unit 270 at such time that it determines that the loading slot 240 is needed for loading or unloading of substrates as discussed herein. The second actuator unit 270 may also be coupled to any other components needed for operation of the second actuator unit 270, such as for example without limitation a source of compressed air when the second actuator unit 270 is a pneumatic actuator.

Although in the exemplified embodiment the loading slot 240 is formed by moving the second door 230 relative to the first door 220 to form the loading slot 240 between the first and second doors 220, 230, the invention is not to be so limited in all embodiments. In other embodiments the loading slot 240 may be formed by moving the first door 220 relative to the second door 230. In still other embodiments, the door assembly 200 may comprise a single door having an opening therein and a cover member covering the opening. The cover member may be a plate or other structural component that covers the opening. In such an embodiment, the cover member may be movable between a first state in which the cover member closes the opening in the door and a second state in which the cover member does not close the opening in the door, thereby forming the loading slot in the door assembly 200. The cover member may move by pivoting relative to the door, sliding relative to the door, or via any other manner that achieves the functionality of exposing the opening in the door for loading and unloading substrates from the heating chamber 101. In the exemplified embodiment the loading slot 240 extends across the entire width of the housing 100, but the invention is not to be so limited and the loading slot 240 may not extend the entire width of the housing 100 in other embodiments. The length of the loading slot 240 may be dictated by the largest diameter substrate intended to be treated in the heating chamber 101.

Referring to FIGS. 9-22, operation of the system 1000 will be described. When it is time to load a substrate into or unload a substrate from the heating chamber 101 of the housing 100, the first step is for the door assembly 200 to be translated or otherwise moved relative to the housing 100 into a desired loading position. The door assembly 200 is movable relative to the housing 100 between a plurality of loading positions by the first actuator unit 250 and the control unit 500. Specifically, the control unit 500 activates the first actuator unit 250 to translate the door assembly 200 as has been described herein above until the door assembly 200 is at a desired position relative to the housing 100 and to the heating chamber 101. FIG. 9 illustrates the door assembly 200 in one such loading position, but the door assembly 200 may be positioned at any desired loading position so that when the loading slot 240 is formed as described below it is aligned with a portion of the heating chamber 101 (i.e., a substrate processing zone) at which it is desired to load or unload a substrate.

Next, referring to FIG. 10, the control unit 500 activates the second actuator unit 270 to move the second door 230 relative to the first door 220, thereby creating the loading slot 240 through the door assembly 200. In the exemplified embodiment, this is achieved by the piston element 271 of the second actuator unit 270 altering from the retracted state to the extended state, such that in the extended state the piston element 271 contacts the second door 230 and forces the second door 230 to translate relative to the first door 220. In the exemplified embodiment the first door 220 does not move at all during this step.

At each loading position, the loading slot 240 is aligned with a different portion of the heating chamber 101 when the door assembly 200 is in the open state. In the exemplified embodiment, each of the loading positions is at a different vertical elevation than each of the other loading positions. When in the desired loading position, the loading slot 240 is aligned with a selected one of the substrate processing zones 103 of the heating chamber 101. More specifically, for each of the plurality of loading positions that the door assembly 200 may be moved to, the loading slot 240 is aligned with a different one of the substrate processing zones 103 when the door assembly 200 is in the open state. This facilitates loading of the substrate 600 into one of the processing zones 103 and onto one of the plurality of partitions 400.

Figure 11:
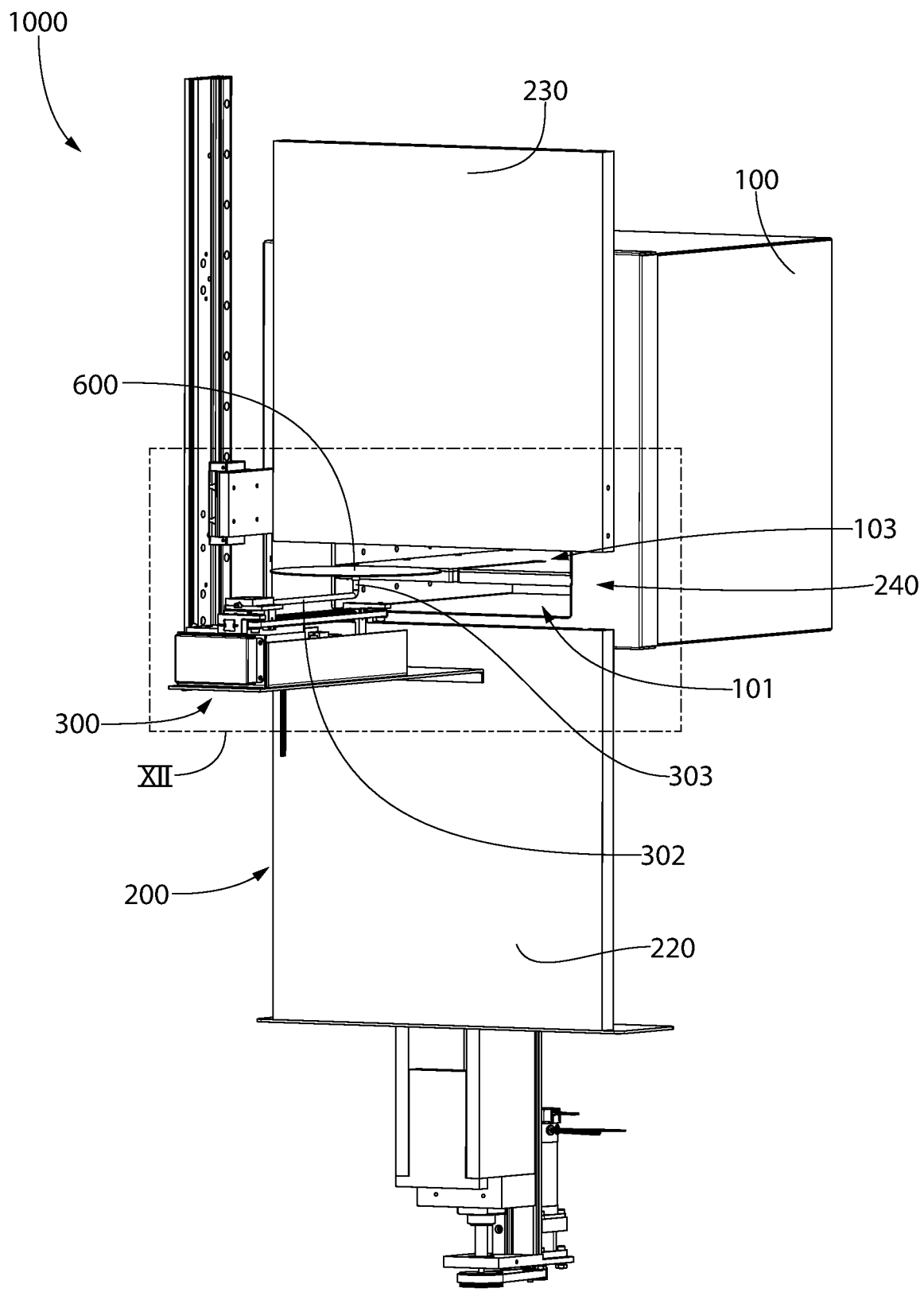
FIG. 11 is a front right perspective view of the system of FIG. 1 with the door assembly in an open state and the loading assembly in the second state, whereby the chuck of the loading assembly is supporting a substrate.
Figure 12:
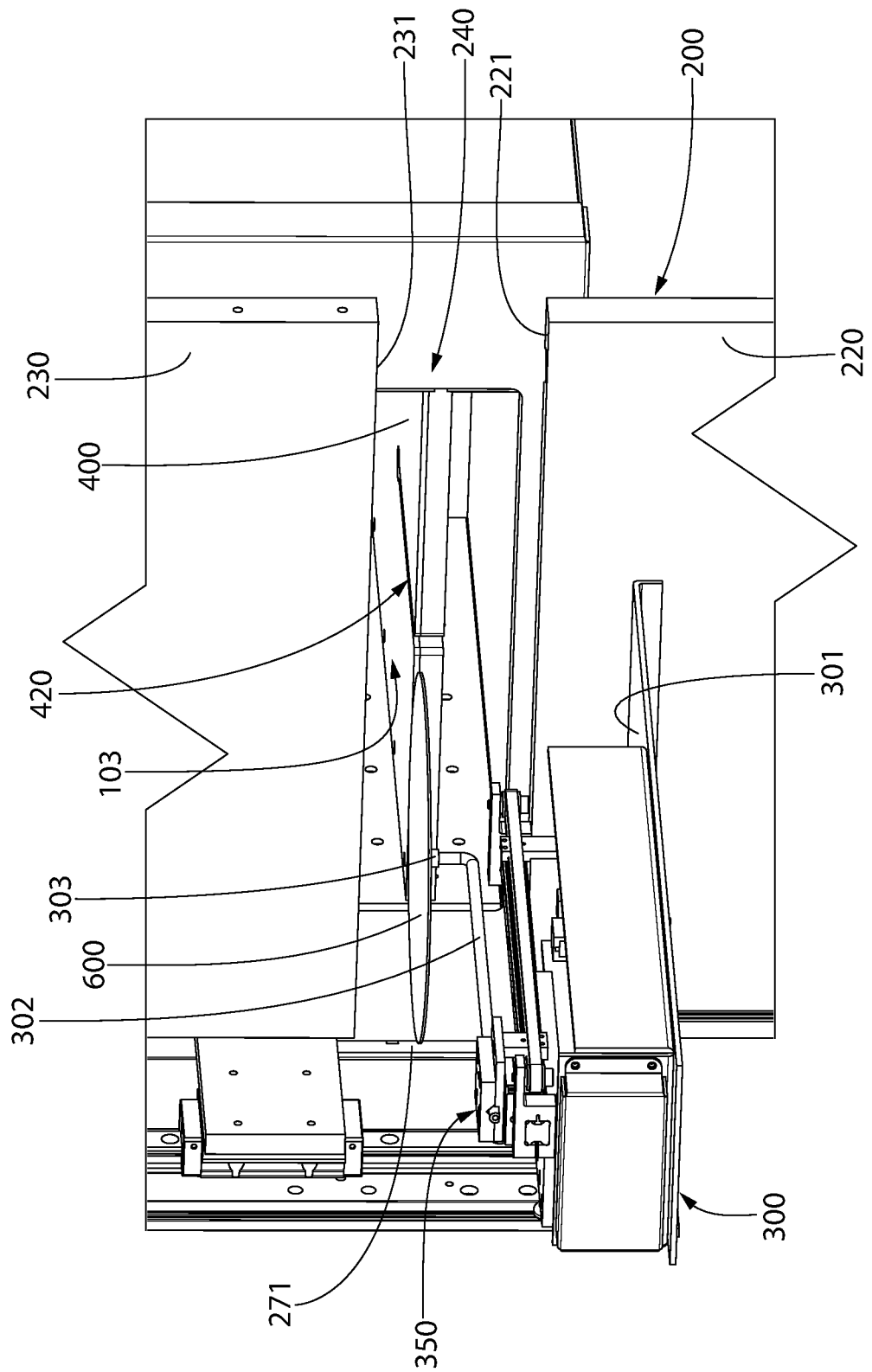
FIG. 12 is a close-up view of area XII of FIG. 11.

Referring to FIGS. 11 and 12, operation of the system 1000 will be further described in terms of loading a substrate 600 into the heating chamber 101. FIG. 12 is merely a close-up view of area XII of FIG. 11 illustrating an identical stage in the loading procedure. The steps described herein for loading the substrate 600 into the heating chamber 101 merely take place in reverse during an unloading operation (i.e., when unloading the substrate 600 from the heating chamber 101). Thus, although an unloading operation will not be specifically described, the process of unloading will be readily understood by persons skilled in the art.

During a loading operation, either before or after the loading slot 240 is formed in one of the manners described herein, the substrate 600 is placed onto the chuck 303 of the loading assembly 300. The placing of the substrate 600 onto the chuck 303 may be achieved automatically by a robot assembly or the like that operates in conjunction with the system 1000. Alternatively, an operator may place the substrate 600 onto the chuck 303 at the appropriate time. The substrate 600 may be held in place on the chuck 303 by suction, clamp members, or the like.

As shown in FIG. 12, the door assembly 200 is in a desired position such that the loading slot 240 is aligned with a selected one of the substrate processing zones 103. In FIG. 12, the loading assembly 300 is in the second state such that the chuck 303 (and hence also the substrate 600 being carried by the chuck 303) is located outside of the heating chamber 101.

Figure 13:
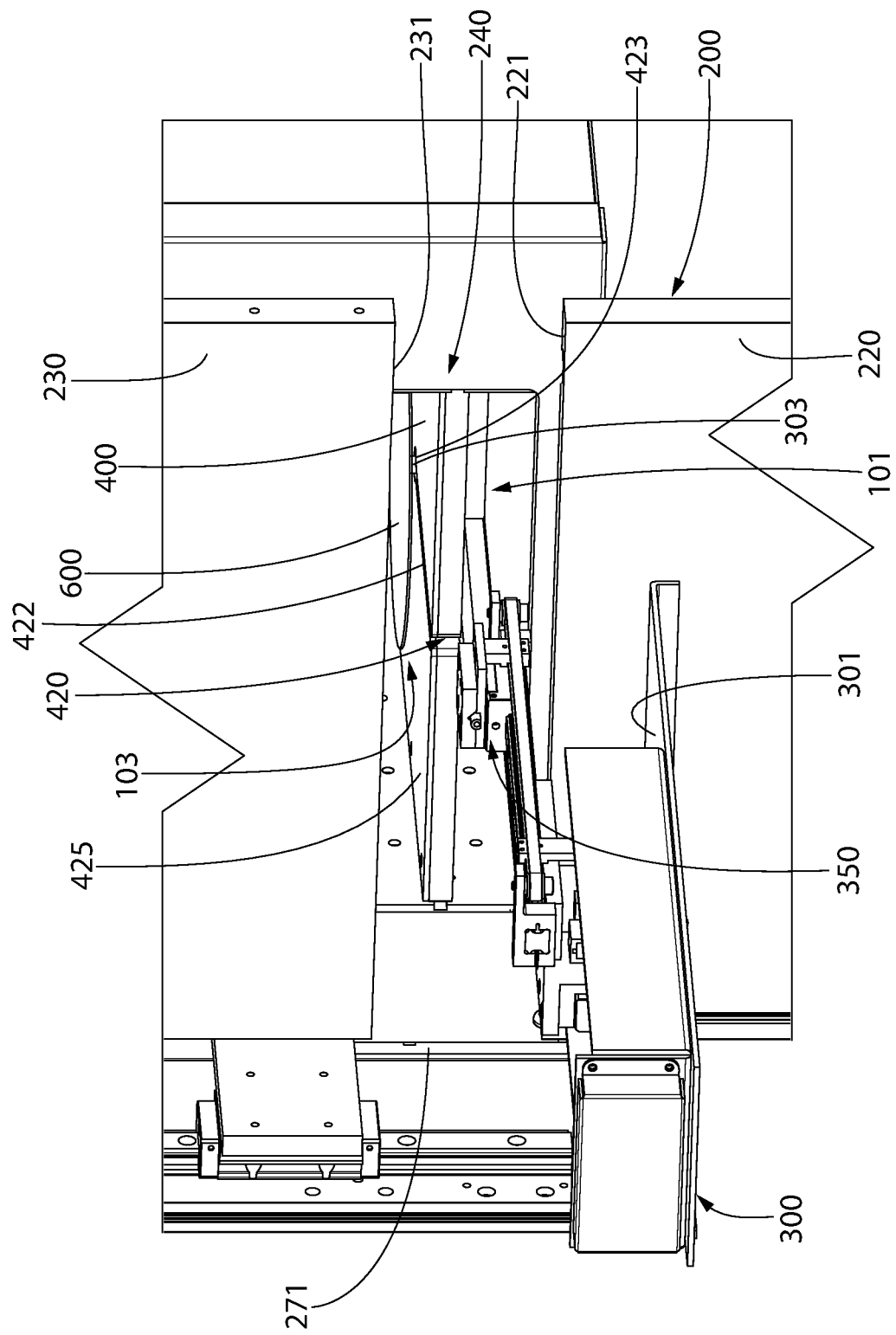
FIG. 13 is the close-up view of FIG. 12 with the loading assembly in the first state such that the chuck and the substrate are positioned in the heating chamber of the housing.

Referring to FIGS. 12 and 13, the next step is for the control unit 500 to activate the third actuator unit 350 to transition the loading assembly 300 from the second state to the first state in which the chuck 303 is positioned within the heating chamber 101. Upon activation of the third actuator unit 350, the support member 302 and the chuck 303 of the loading assembly 300 move linearly into the heating chamber 101 in a direction perpendicular to the longitudinal axis A-A of the housing 100. As the support member 302 and the chuck 303 enter the heating chamber 101, the support member 302 passes into the elongated slot 420 in the partition 400 on which the substrate 600 is going to be positioned. The support member 302 extends through the elongated slot 420 so that the chuck 303 is located adjacent the upper surface 425 of the partition 400. The support member 302 and the chuck 303 continue to move linearly into the heating chamber 101 until the chuck 303 is aligned with the loading section 423 of the elongated slot 420, as illustrated in FIG. 13. During this movement, the support member 302 of the loading assembly 300 is located within the elongated slot 420 of the partition 400, the chuck 303 is adjacent the upper surface 425 of the partition 400, and the substrate 600 is located at a distance above the upper surface 425 of the partition 400.

Figure 14:
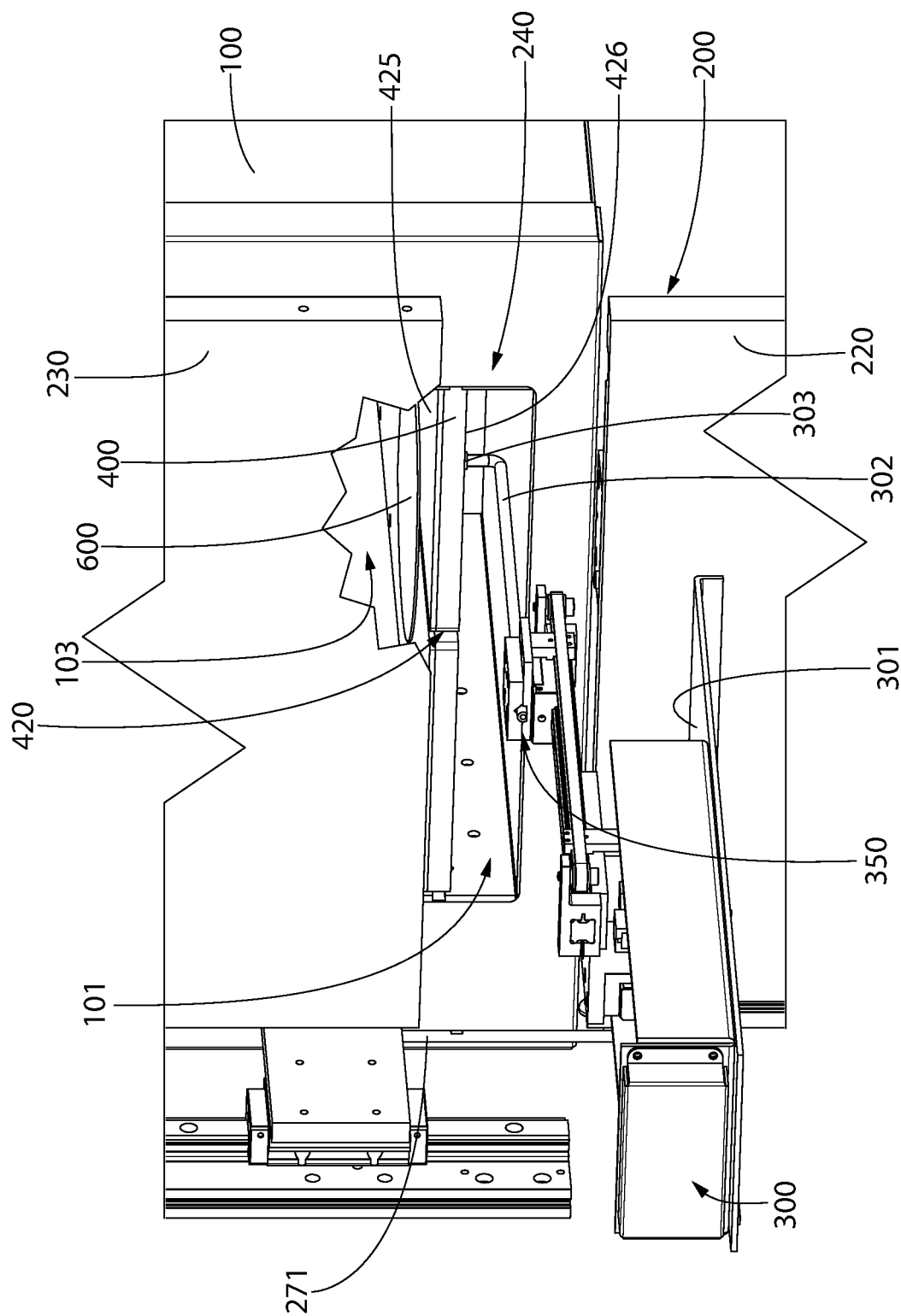
FIG. 14 is the close-up view of FIG. 13 illustrating the door assembly lowered to release the substrate from the chuck.

Referring to FIGS. 13 and 14, the next step is to lower the door assembly 200 until the substrate 600 is resting directly atop of the upper surface 425 of the partition 400 (i.e., the substrate 600 is in direct surface contact with the upper surface 425 of the partition 400). More specifically, the door assembly 200 is lowered until the substrate 600 is entirely supported by the partition 400 and is no longer supported by the chuck 303. This is achieved by the control unit 500 activating the first actuator unit 250 to lower the door assembly 200 a sufficient amount. As the door assembly 200 is lowered, the chuck 303 passes through the loading section 423 of the elongated slot 420. As the chuck 303 passes through the loading section 423 of the elongated slot 420, the substrate 600 disengages from the chuck 303 and rests on the upper surface 425 of the partition 400 because the substrate 600 is too large to fit through the loading section 423 of the elongated slot 420. The door assembly 200 continues to be lowered until the chuck 303 exits the elongated slot 420 and becomes located adjacent the lower surface 426 of the partition 400 that is opposite the upper surface 425 of the partition 400. In the exemplified embodiment, this amount of lowering of the door assembly 200 is necessary in order to be able to remove the chuck 303 and the support member 302 of the loading assembly 300 from the heating chamber 101. Specifically, the chuck 303 has a larger cross-sectional area than the entry section 422 of the elongated slot 420 in the partition 400 and thus it is necessary to remove the chuck 303 from the elongated slot 420 entirely before the chuck 303 can be removed from the heating chamber 101. Of course, other embodiments are possible whereby the elongated slot 420 has a larger cross-sectional area so that the chuck 303 can remain within the elongated slot 420 as the loading assembly 300 transitions between the first and second states.

Figure 15:
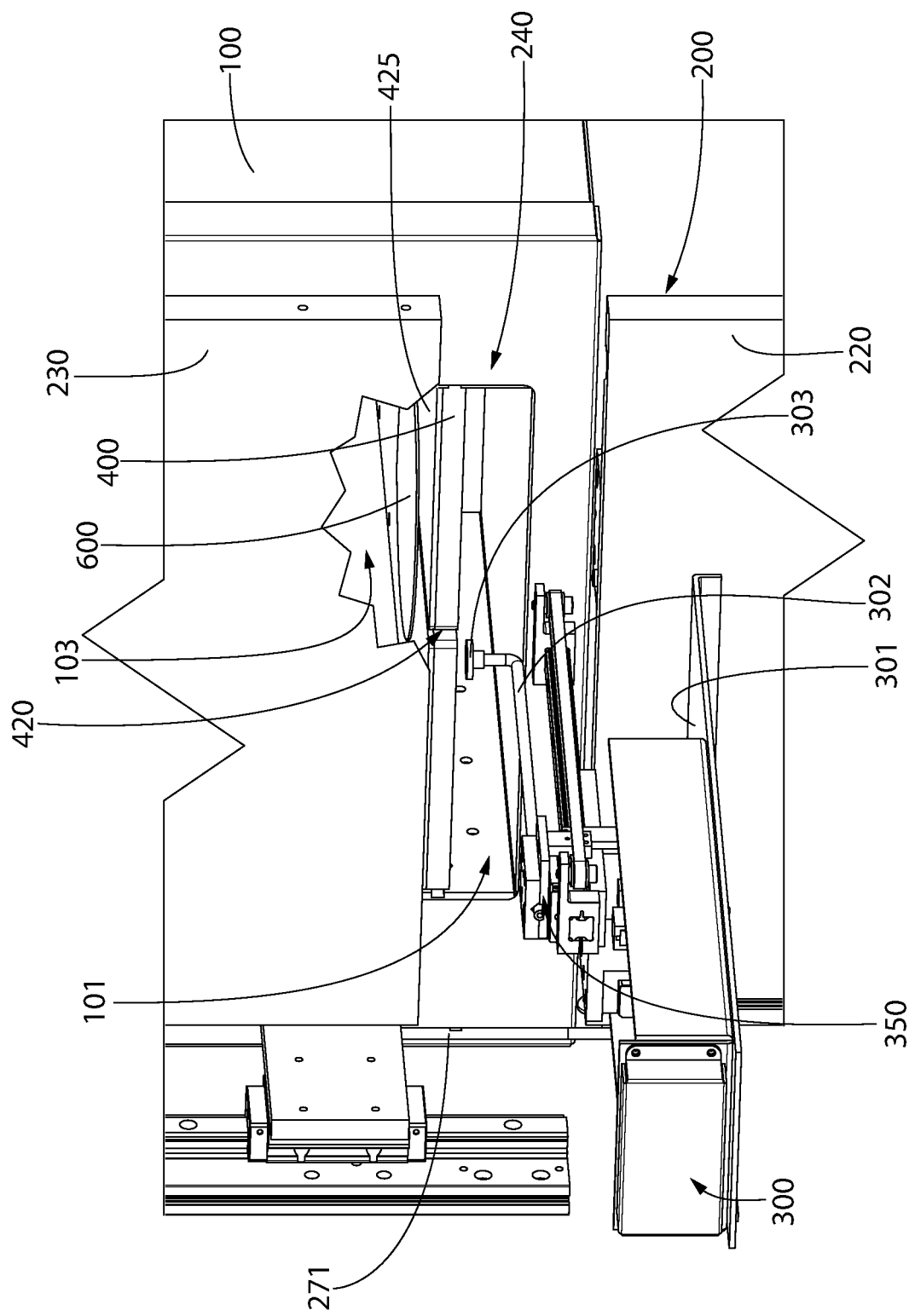
FIG. 15 is the close-up view of FIG. 14 illustrating the loading assembly being retracted from the heating chamber.

Referring to FIGS. 14 and 15, the next step is for the control unit 500 to activate the third actuator unit 350 to transition the loading assembly 300 from the first state (chuck 303 positioned in the heating chamber 101 as shown in FIG. 14) to the second state (chuck 303 located outside of the heating chamber 101 as shown in FIG. 15). In this step, the chuck 303 is removed from the heating chamber 101 without taking the substrate 600 with it. Rather, the substrate 600 remains positioned on the partition 400 for heat treatment of the substrate 600 within the heating chamber 101.

Figure 16:
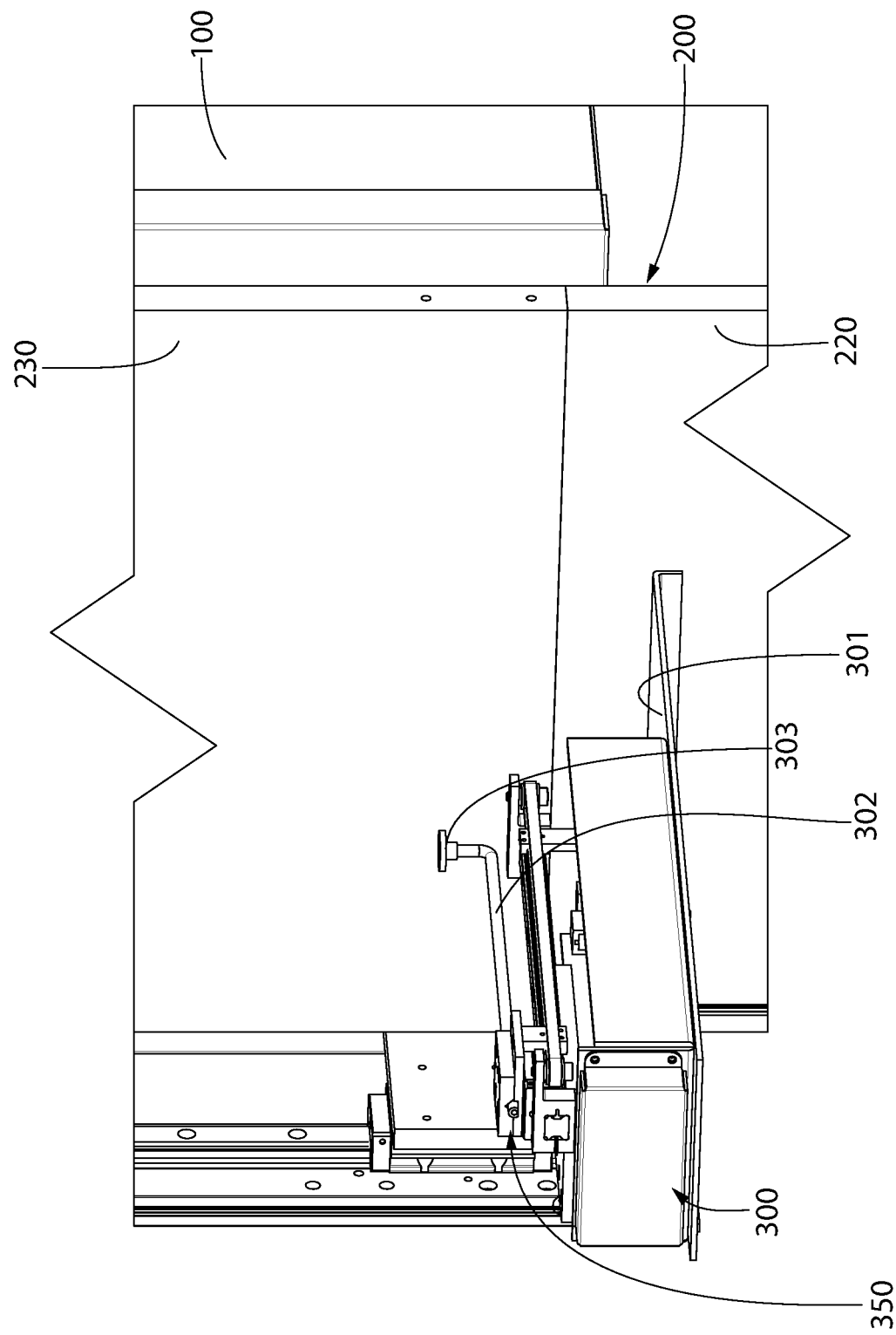
FIG. 16 is the close-up view of FIG. 15 illustrating the loading assembly returned to the second state with the chuck located outside of the heating chamber and the door assembly returned to the closed state.

Referring to FIGS. 15 and 16, once the chuck 303 has been completely removed from the heating chamber 101, the control unit 500 may activate the second actuation unit 270 to alter the piston element 271 from the extended state to the retracted state. This will alter the first and second doors 220, 230 from the separated state to the contact state such that the loading slot 240 becomes closed. This step is necessary to prevent heat from flowing out of the heating chamber 101 when substrates are not being loaded into or unloaded from the heating chamber 101. If additional loading or unloading is not going to take place, the rubber tubes 109 may be inflated to seal the opening 102 of the heating chamber 101 as described above.

Figure 17:
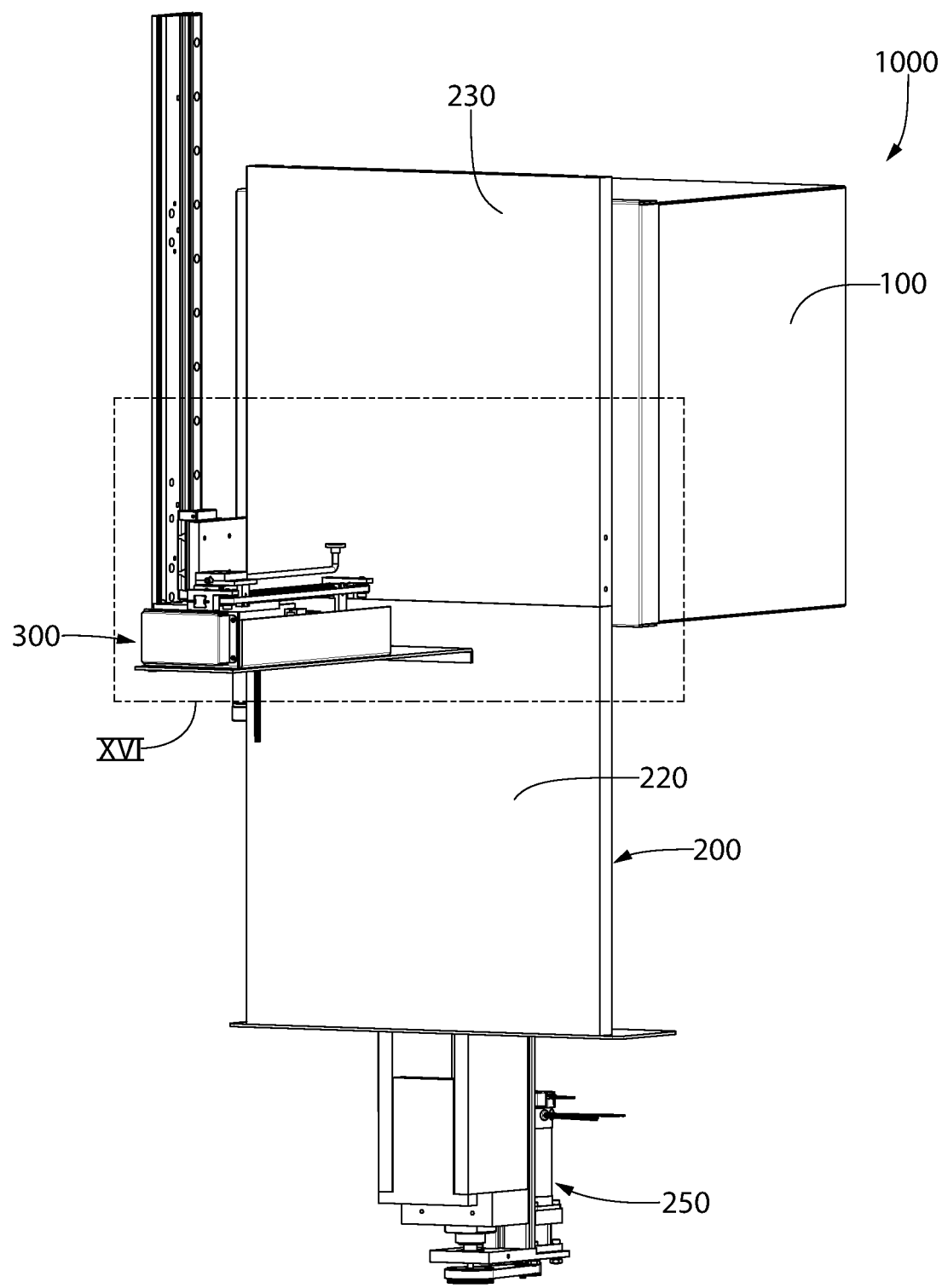
FIG. 17 is a full perspective view of the system in accordance with FIG. 16.

FIG. 16 is a close-up view of area XVI of FIG. 17. Thus, FIG. 17 illustrates the same stage in the operation as FIG. 16 except it shows the entire system 1000.

As noted above, it should be appreciated that during unloading of a substrate from the heating chamber 101, the aforementioned steps take place in reverse order. Specifically, the door assembly 200 is moved relative to the housing to align it with a selected substrate processing zone 103. Next, the door assembly 200 is transitioned to the open state. Next, the loading assembly 300 is altered from the second state to the first state. However, when unloading a substrate from the heating chamber 101, the chuck 303 of the loading assembly 300 is located adjacent the lower surface 426 of the partition 400 on which the substrate being removed is located when the loading assembly 300 is altered from the second state to the first state. Next, the door assembly 200 is moved upwardly so that the chuck 303 passes through the loading section 423 of the elongated slot 420 of the partition 400. As the chuck 303 passes through the loading section 423 of the elongated slot 420, the chuck 303 will engage the substrate being unloaded/removed from the heating chamber 101. The door assembly 200 is moved upwardly until the substrate being removed is fully supported by the chuck 303 (i.e., the substrate is spaced apart from the upper surface 425 of the partition 400) and the chuck 303 is adjacent to the upper surface 425 of the partition 400. At this point, the loading assembly 300 is altered from the first state back to the second state to remove the chuck 303 and the substrate from the heating chamber 101. The substrate can then be removed from the chuck 303 and taken to the next stage of its processing.

Figure 18:
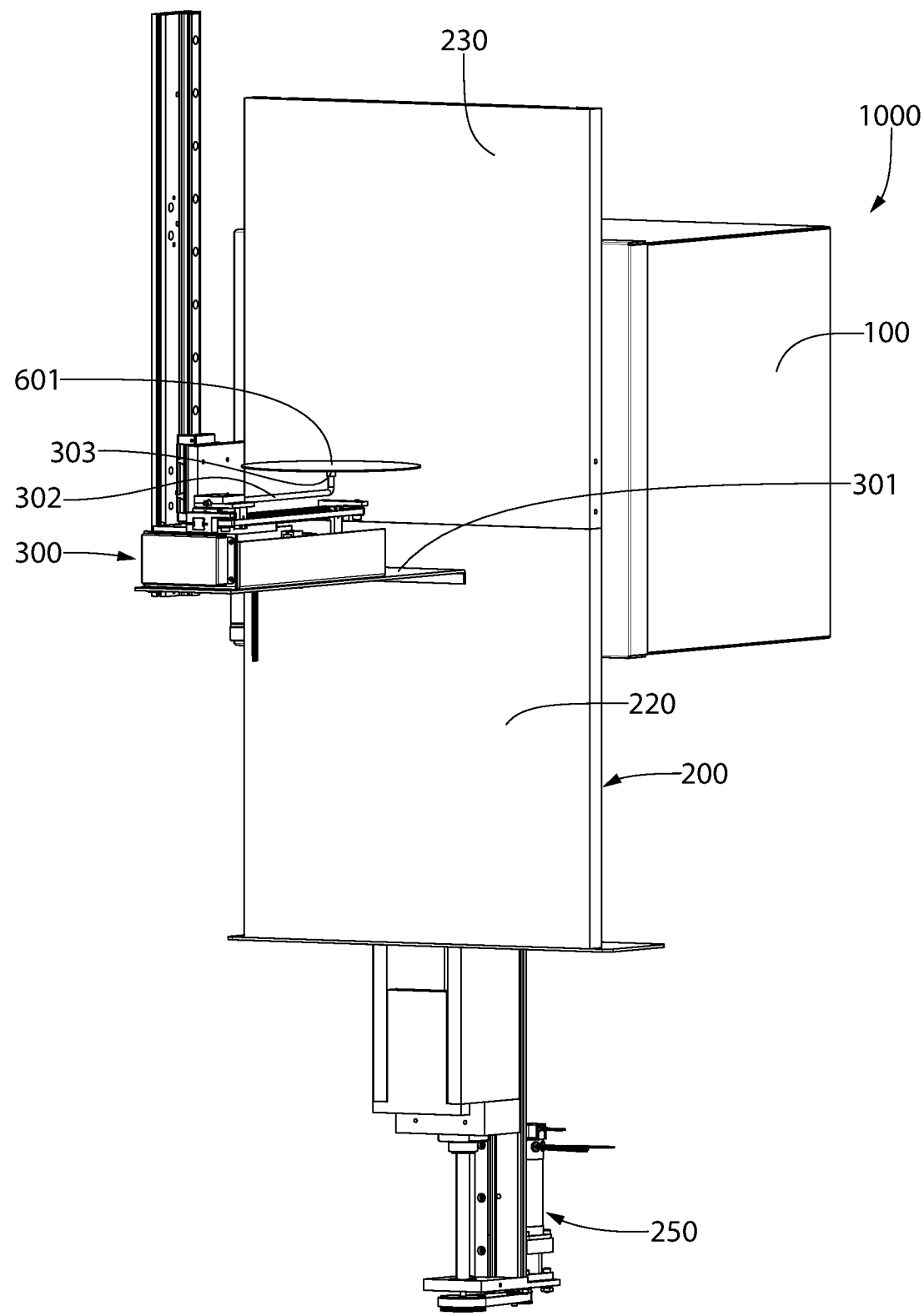
FIG. 18 is the perspective view of the system of FIG. 17 with the door assembly translated upwardly into another loading position so that a second substrate can be loaded into the heating chamber at another location.

FIGS. 18-22 illustrate the loading of a second substrate 600 into the heating chamber 101. Referring to FIGS. 17 and 18, if it is desired to load another substrate into the heating chamber, the next step is for the control unit 500 to activate the first actuator unit 250 to move the door assembly 200 relative to the housing 100 so that the loading slot 240 that is later opened is aligned with another portion of the heating chamber 101 (i.e., with a substrate processing zone 103 that is different than the substrate processing zone 103 that the substrate 600 was placed into). The door assembly 200 is illustrated in a different position relative to the housing in FIG. 18 than in FIG. 17. Specifically, in FIG. 18 the door assembly 200 has been translated upwardly relative to the housing 100. FIG. 18 also illustrates the chuck 303 of the loading assembly 300 supporting a substrate 601.

Figure 19:
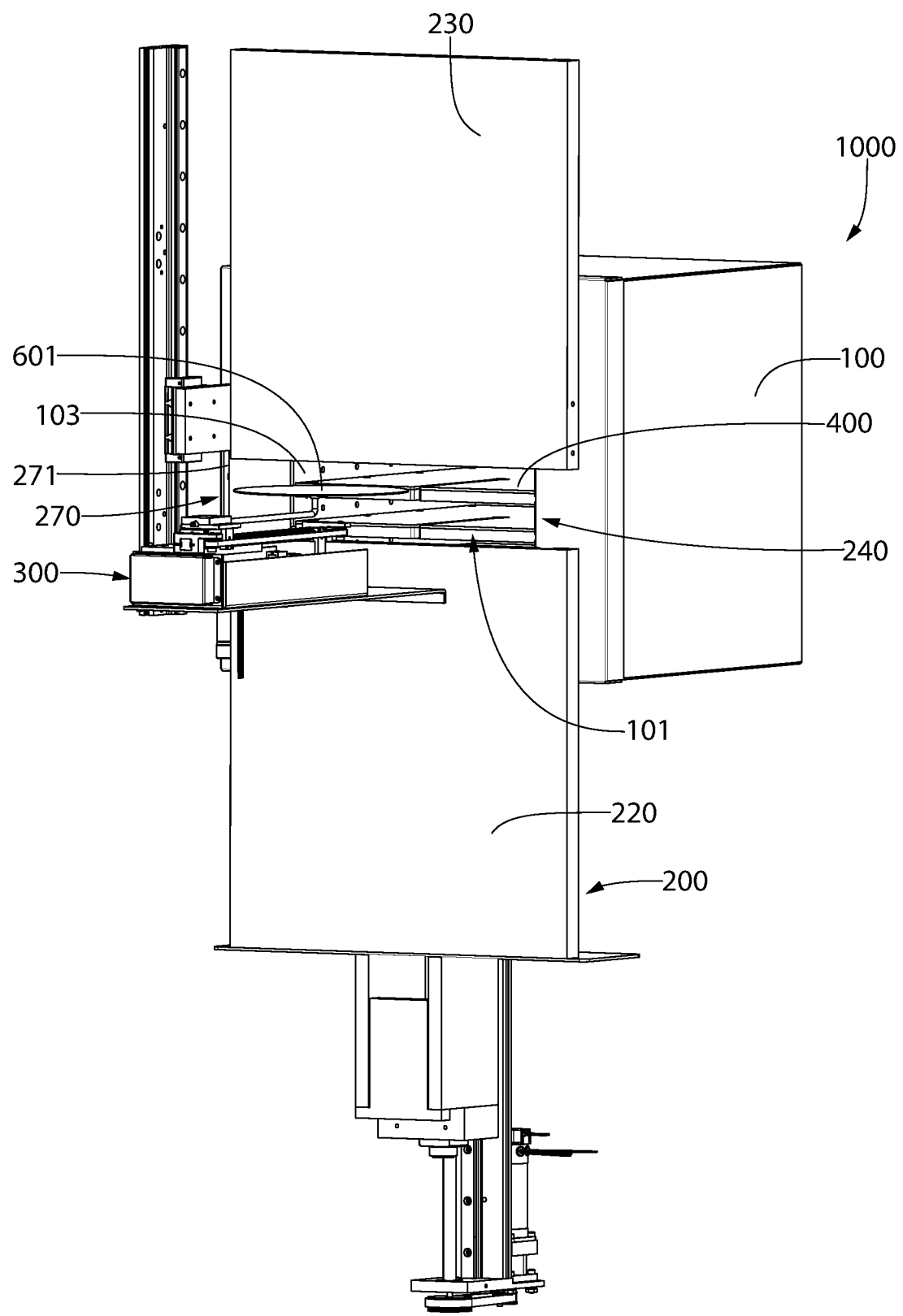
FIG. 19 is the perspective view of FIG. 18 with the door assembly actuated into the open state and the chuck of the loading assembly supporting another substrate.

Referring to FIGS. 18 and 19, the next step is for the control unit 500 to activate the second actuator unit 270 to alter the piston element 271 of the second actuator unit 270 from the retracted state (FIG. 18) to the extended state (FIG. 19). Again, in the extended state the piston element 271 is extended and presses against the second door 230 to move the second door 230 upwardly relative to the first door 220. This action forms the loading slot 240 in the door assembly 200.

Figure 20:
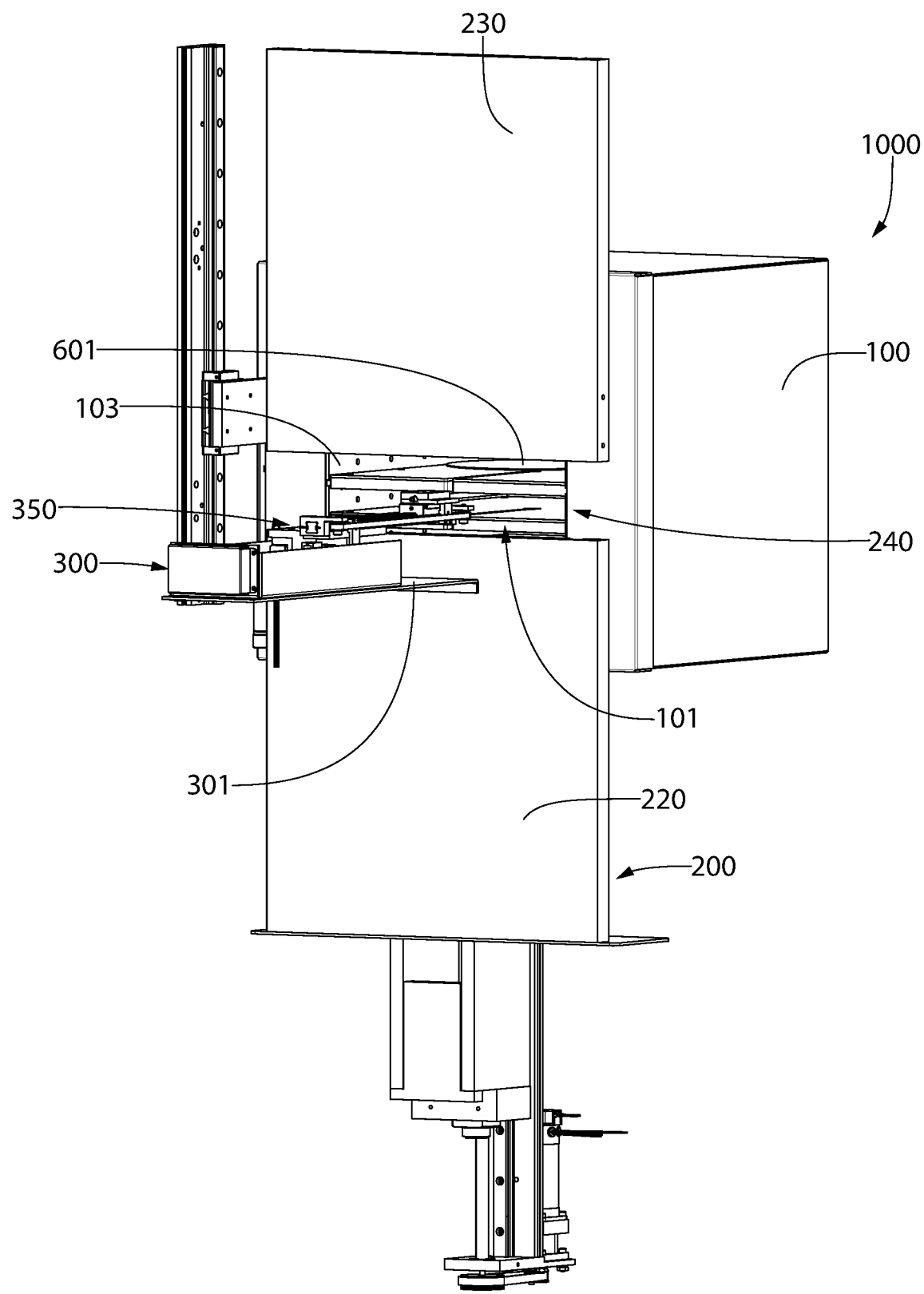
FIG. 20 is the perspective view of FIG. 19 with the loading assembly actuated into the first state with the chuck positioned within the heating chamber.

Next, referring to FIGS. 19 and 20, the control unit 500 activates the third actuator unit 350 to alter the loading assembly 300 from the second state in which the chuck 303 and the substrate 601 carried by the chuck 303 are located outside of the heating chamber 101 (FIG. 19) to the first state in which the chuck 303 and the substrate 601 carried by the chuck 303 are positioned within the heating chamber 101 (FIG. 20).

Figure 21:
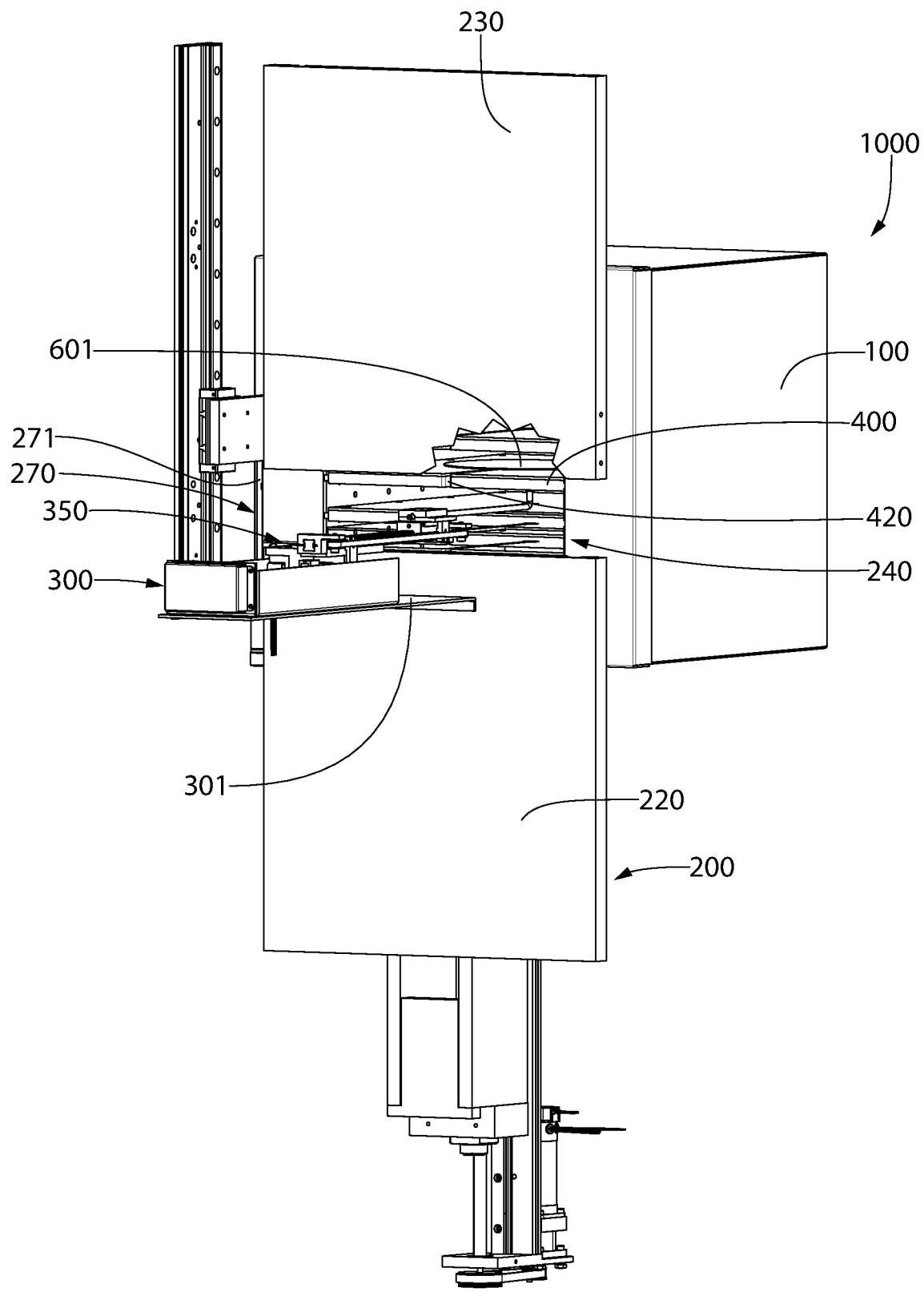
FIG. 21 is the perspective view of FIG. 20 illustrating the door assembly lowered to release the substrate from the chuck.

Next, referring to FIGS. 20 and 21, the first actuator unit 250 is activated by the control unit 500 to lower the door assembly 200 so that the chuck 303 passes through the elongated slot 420 in the partition 400 and the substrate 601 rests atop the partition 400.

Figure 22:
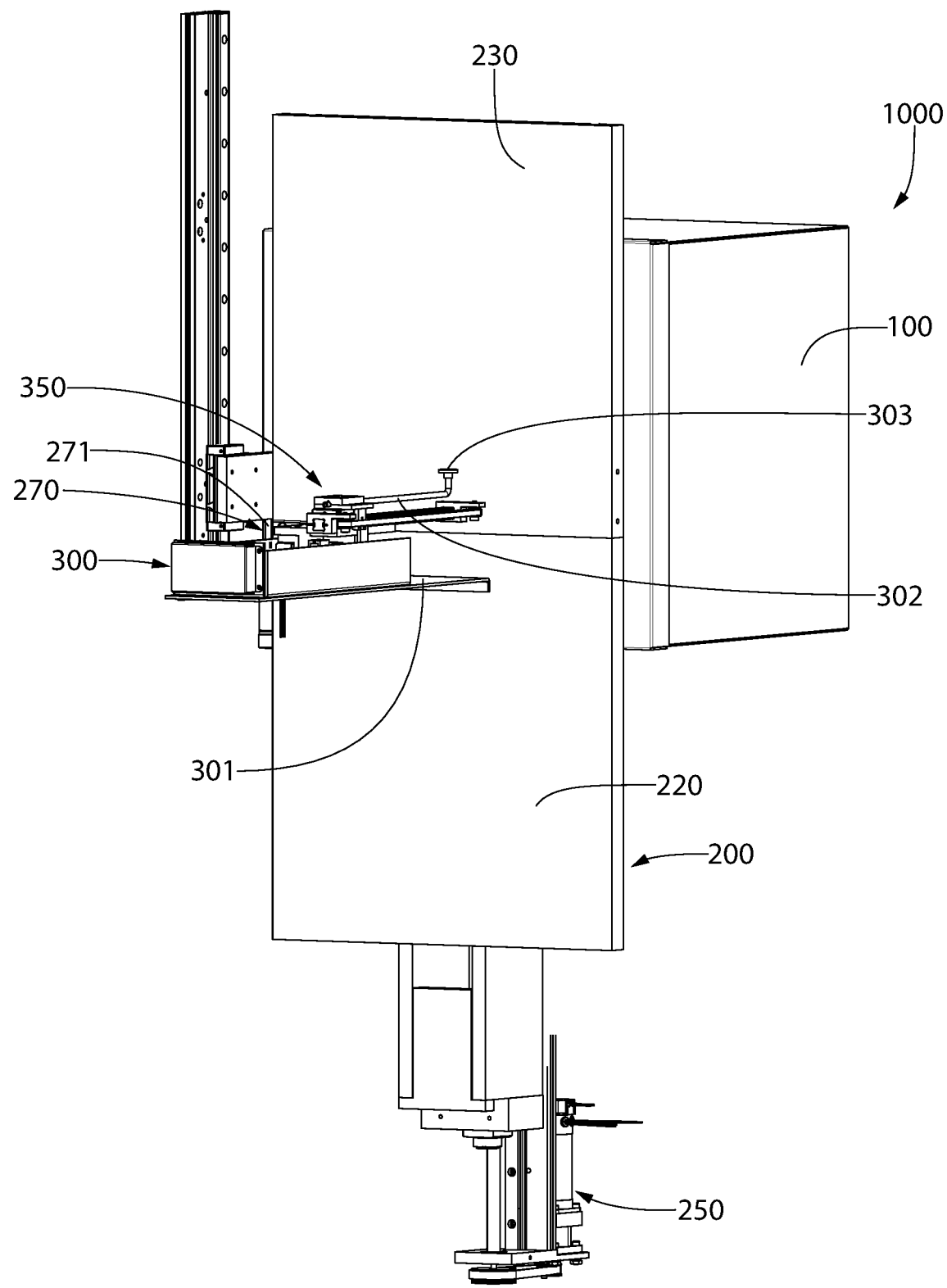
FIG. 22 is the perspective view of FIG. 21 illustrating the loading assembly returned to the second state and the door assembly returned to the closed state.

Finally, referring to FIGS. 21 and 22, the third actuator unit 250 is activated by the control unit 500 to retract the chuck 303 of the loading assembly 300 into the second state in which the chuck 303 is located outside of the heating chamber 101. Thereafter, the control unit 500 activates the second actuator unit 270 to retract the piston element 271 of the second actuator unit 270 so that the door assembly 200 can be altered into the closed state. When the piston element 271 is retracted, the second door 230 falls into contact with the first door 220 via gravity because in the exemplified embodiment the second door 230 is supported directly by the first door 220 when the door assembly 200 is in the closed state. The door assembly 200 can then be moved again relative to the housing 100 for another loading or unloading operation or the door assembly 200 can remain in its position for a predetermined period of time while the substrates 600, 601 in the heating chamber 101 are baked, after which time the system 1000 may function to unload the substrates 600, 601 from the heating chamber 101 in the manner described herein.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A system for heat treatment of substrates comprising:
a housing defining a heating chamber having an opening;
a plurality of partitions located within the heating chamber to separate the heating chamber into a plurality of substrate processing zones;
a door-assembly enclosing the opening of the heating chamber, the door-assembly alterable between: (1) an open state in which a loading slot is formed through the door-assembly, the loading slot forming a passageway into a selected one of the plurality of substrate processing zones of the heating chamber for loading substrates into and unloading substrates from the selected one of the plurality of substrate processing zones; and (2) a closed state in which the door-assembly closes all of the plurality of substrate processing zones;
a first actuator unit operably coupled to the door-assembly; and
a control unit operably coupled to the first actuator unit to move the door-assembly relative to the housing between a plurality of loading positions so that, for each of the plurality of loading positions, the loading slot is aligned with a different one of the plurality of substrate processing zones of the heating chamber when the door-assembly is in the open state.

2. The system according to claim 1 wherein the first actuator unit is configured to translate the door-assembly relative to the housing between the plurality of loading positions, wherein the housing extends from a bottom end to a top end along a longitudinal axis, and wherein the first actuator unit is configured to translate the door-assembly in a direction substantially parallel to the longitudinal axis between the plurality of loading positions.

3. The system according to claim 1 further comprising:
the door assembly comprising a first door and a second door;
the first and second doors movable relative to one another between: (1) a separated state in which an edge of the second door is spaced apart from an edge of the first door, thereby at least partially defining the loading slot between the edges of the first and second doors to achieve the open state; and (2) a contact state in which the edge of the second door abuts the edge of the first door, thereby closing the loading slot to achieve the closed state.

4. The system according to claim 3 further comprising a second actuator unit operably coupled to the control unit, the control unit configured to alter the first and second doors between the separated state and the contact state using the second actuator unit.

5. The system according to claim 4 wherein the second actuator unit is mounted to one of the first or second doors.

6. The system according to claim 5 wherein the second actuator unit comprises a piston element that is alterable between: (1) a retracted state in which the piston element is retracted and allows the first and second doors to assume the contact state; and (2) an extended state in which the piston element is extended, thereby creating relative movement between the first and second doors to achieve the separated state.

7. The system according to claim 3 wherein the second door is located above the first door and is gravity biased into the contact state.

8. The system according to claim 1 further comprising a loading assembly mounted to the door-assembly for movement therewith, the loading assembly comprising a support member having a chuck configured to hold a substrate, the loading assembly configured to load and unload substrates from the heating chamber via the loading slot when the door-assembly is in the open state.

9. The system according to claim 8 further comprising:
a third actuator unit operably coupled to the control unit and to the loading assembly;
the control unit further configured to alter the loading assembly, when the door assembly is in the open state, using the third actuator unit between: (1) a first state in which the chuck is positioned within the heating chamber; and (2) a second state in which the chuck is outside of the heating chamber; and
wherein the chuck passes through the loading slot when the loading assembly transitions between the first and second states.

10. The system according to claim 9 wherein, during a substrate release step, the control unit is configured to lower the door assembly relative to the housing while the door assembly is maintained in the open state and the loading assembly is in the first state.

11. The system according to claim 1 further comprising, for each of the plurality of partitions, an elongated slot extending from a front edge of the partition that is adjacent the opening towards a rear edge of the partition, the elongated slot configured to at least partially receive a support member of a loading assembly.

12. The system according to claim 1 wherein each of the partitions comprises at least one heating source configured to heat at least one of the plurality of substrate processing zones of the heating chamber.

13. A system for heat treatment of substrates comprising:
a housing extending along a longitudinal axis and defining a heating chamber having an opening;
a plurality of partitions located within the heating chamber to separate the heating chamber into a plurality of substrate processing zones;
a door-assembly enclosing the opening of the heating chamber, the door-assembly comprising a loading slot through which substrates can be passed into and out of the heating chamber;
a loading assembly mounted to the door-assembly, the loading assembly comprising a support member having a chuck configured to hold a substrate, the loading assembly configured to load and unload substrates from the heating chamber via the loading slot;
a first actuator unit operably coupled to the door-assembly; and
a control unit operably coupled to the first actuator unit to simultaneously move the door-assembly and the loading assembly relative to the housing in a direction parallel to the longitudinal axis between a plurality of loading positions so that, for each of the plurality of loading positions, the loading slot and the chuck are aligned with a different one of the plurality of substrate processing zones of the heating chamber.

14. The system according to claim 13 wherein the loading assembly comprises a chassis fixedly mounted to the door-assembly so that movement of the door-assembly by the first actuator results in a corresponding movement of the loading assembly, the support member supported by the chassis.

15. The system according to claim 14 wherein the door-assembly comprises a first door and a second door, the first and second doors movable relative to one another to achieve open and closed states of the door-assembly.

16. The system according to claim 13 further comprising:
a third actuator unit operably coupled to the control unit and to the loading assembly;
the control unit further configured to alter the loading assembly, when the door-assembly is in an open state, using the third actuator unit between: (1) a first state in which the chuck is positioned within the heating chamber; and (2) a second state in which the chuck is outside of the heating chamber; and
wherein the chuck passes through the loading slot when the loading assembly transitions between the first and second states.

17. The system according to claim 16 wherein, during a substrate release step, the control unit is configured to lower the door-assembly relative to the housing while the door-assembly is maintained in the open state and the loading assembly is in the first state.

18. The system according to claim 13 wherein, for each of the plurality of loading positions, the loading slot is aligned with a different one of the substrate processing zones when the door-assembly is in an open state, thereby allowing a substrate to be loaded or unloaded from a selected one of the substrate processing zones.

19. A system for heat treatment of substrates comprising:
a housing defining a heating chamber having an opening;
a plurality of partitions located within the heating chamber to separate the heating chamber into a plurality of substrate processing zones;
a door-assembly comprising a first door and a second door, the door-assembly alterable between: (1) a closed state in which an edge of the first door and an edge of the second door are in contact at an interface and the door-assembly closes the opening; and (2) an open state in which the edge of the first door and the edge of the second door are spaced apart so that a passageway exists through the door-assembly and into the heating chamber, the first and second doors being located on opposite sides of the passageway;
a loading assembly mounted to the door-assembly, the loading assembly comprising a support member having a chuck;
a first actuator unit and a second actuator unit operably coupled to the door assembly and a third actuator unit operably coupled to the loading assembly;
a control circuit operably coupled to the first, second, and third actuator units to: (1) move the door-assembly relative to the housing between a plurality of loading positions using the first actuator unit so that, for each of the plurality of loading positions, the interface of the first and second doors is aligned with a different one of the substrate processing zones of the heating chamber; (2) separate the first and second doors from one another using the second actuator unit to form the passageway through the door-assembly, the passageway being aligned with a selected one of the substrate processing zones of the heating chamber; and (3) alter the loading assembly, using the third actuator unit, from a first state in which the chuck is located outside of the heating chamber to a second state in which the chuck is located inside of the heating chamber to load a substrate into the selected one of the plurality of substrate processing zones.

20. The system according to claim 19 wherein the second actuator unit comprises a piston element that is alterable between: (1) a retracted state in which the piston element is retracted and the first and second doors assume a contact state, wherein the second door is located above the first door and is gravity biased into contact with the first door when the piston element is in the retracted state; and (2) an extended state in which the piston element is extended, thereby separating the first and second doors to form the passageway.

* * * * *